(12) United States Patent
Arima et al.

(10) Patent No.: US 7,970,092 B2
(45) Date of Patent: Jun. 28, 2011

(54) PHASE COMPARATOR AND REGULATION CIRCUIT

(75) Inventors: Yukio Arima, Osaka (JP); Toru Iwata, Osaka (JP); Makoto Miyake, Osaka (JP); Takefumi Yoshikawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 609 days.

(21) Appl. No.: 12/090,774

(22) PCT Filed: Mar. 10, 2006

(86) PCT No.: PCT/JP2006/304779
§ 371 (c)(1),
(2), (4) Date: Apr. 18, 2008

(87) PCT Pub. No.: WO2007/060756
PCT Pub. Date: May 31, 2007

(65) Prior Publication Data
US 2009/0262876 A1    Oct. 22, 2009

(30) Foreign Application Priority Data

Nov. 22, 2005   (JP) .................................. 2005-337542

(51) Int. Cl.
*H03D 3/24* (2006.01)
(52) U.S. Cl. ........ 375/376; 375/374; 375/371; 375/373; 327/148; 327/152; 327/157
(58) Field of Classification Search ................. 375/374, 375/371, 373, 376; 327/147, 148, 152, 156, 327/157, 234, 235, 236
See application file for complete search history.

(56) References Cited

U.S. PATENT DOCUMENTS

| 5,889,423 | A  | * | 3/1999  | Trumpp ........................ 327/298 |
| 6,222,419 | B1 | * | 4/2001  | Yoshida ........................... 331/11 |
| 6,442,225 | B1 | * | 8/2002  | Huang ........................... 375/376 |
| 6,711,229 | B1 | * | 3/2004  | Harada .......................... 375/376 |
| 7,109,766 | B2 | * | 9/2006  | White et al. .................. 327/158 |
| 7,154,342 | B2 | * | 12/2006 | Munker et al. ................. 331/11 |
| 2002/0047738 | A1 |   | 4/2002  | Kamihara |
| 2003/0227310 | A1 | * | 12/2003 | Iwata ............................ 327/165 |

FOREIGN PATENT DOCUMENTS

| JP | 2002-198785 | 7/2002 |
| JP | 2002-198941 | 7/2002 |
| JP | 2004-15689  | 1/2004 |

* cited by examiner

*Primary Examiner* — Dac V Ha
*Assistant Examiner* — Rahel Guarino
(74) *Attorney, Agent, or Firm* — McDermott Will & Emery LLP

(57) ABSTRACT

A phase comparison process in a timing recovery process for high-speed data communication defines a data window and compares the phase of a clock in the window with the phase of an edge of data so as to realize a parallel process, wherein the phase comparison and the process of determining whether a data edge lies within the window are performed in parallel to each other, and the phase comparison result is output only if the data edge lies within the window. With this configuration, it is possible to perform an accurate phase comparison process with no errors without requiring high-precision delay circuits.

23 Claims, 25 Drawing Sheets

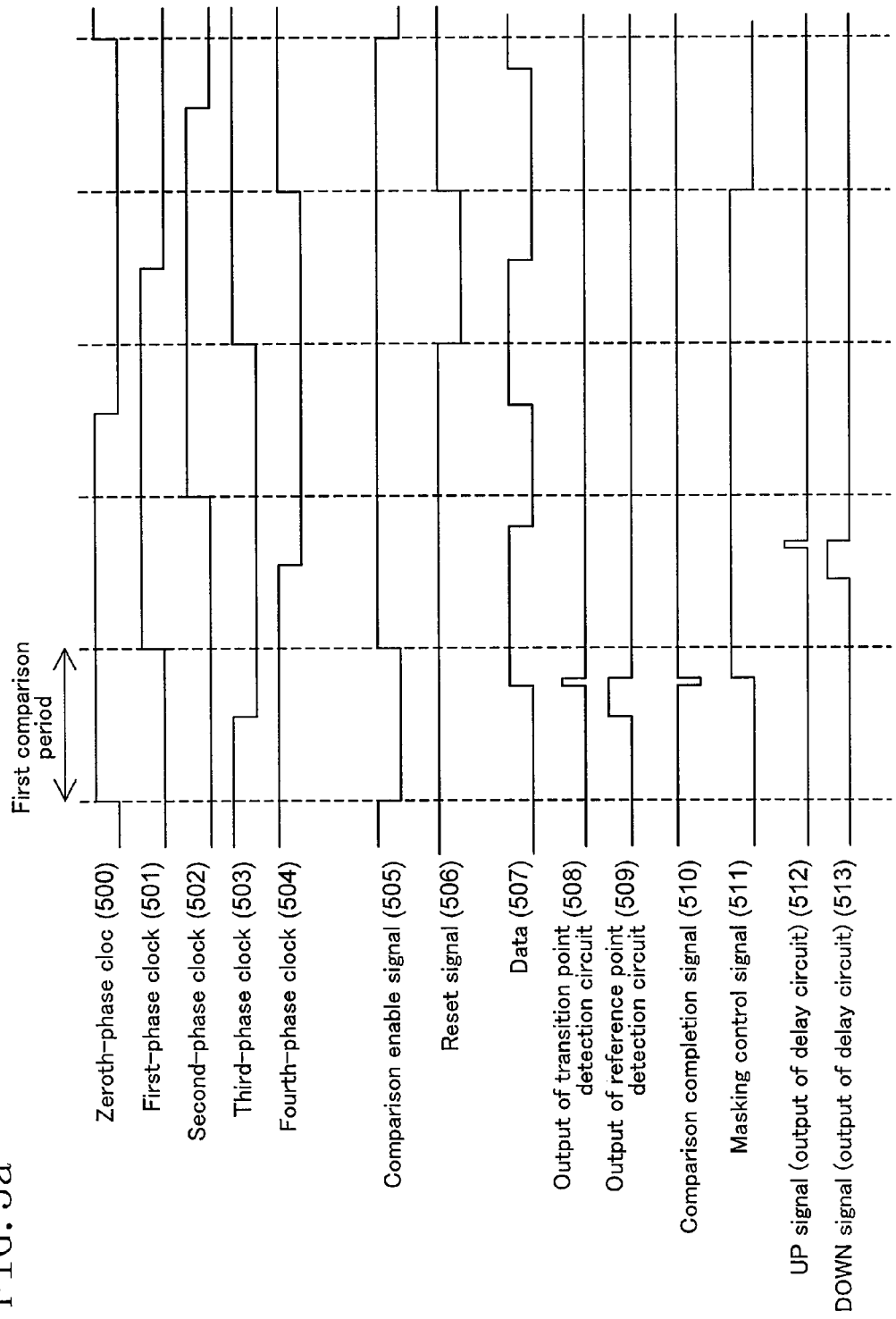

PHASE COMPARATOR AND REGULATION CIRCUIT

RELATED APPLICATIONS

This application is the U.S. National Phase under 35 U.S.C. §371 of International Application No. PCT/JP2006/304779, filed on Mar. 10, 2006, which in turn claims the benefit of Japanese Application No. 2005-337542, filed on Nov. 22, 2005, the disclosures of which Applications are incorporated by reference herein.

TECHNICAL FIELD

The present invention relates to a phase regulation technique for synchronizing received data with a clock signal in data communication.

BACKGROUND ART

In data communication between devices, since the clock of the receiving device and that of the transmitting device are not synchronized with each other, and the clock frequencies are also not equal to each other due to differences in operation environments such as the power supply noise and the temperature, the receiving device needs to reproduce the clock based on the received data. This process is commonly referred to as "timing recovery" or "data clock recovery".

A typical timing recovery technique repeats the process of generating a clock on the receiving side, detecting the phase difference between the clock and the received data, and adjusting the frequency or the phase of the clock based on the detected phase difference.

FIG. 23 shows a typical phase difference detection circuit. In this figure, 161 denotes a data detection circuit, 162 a clock detection circuit, and 163 a determination circuit. The data detection circuit 161 and the clock detection circuit 162 are flip flop circuits having data pins fixed to H level, clock pins receiving the received data and the clock, respectively, and reset pins receiving the reset signal output from the determination circuit 163. When the received data goes H, the output of the data detection circuit 161 goes H, which is output as an UP signal. Similarly, when the clock signal goes H, the output of the clock detection circuit 162 goes H, which is output as a DOWN signal. The determination circuit 163 monitors the output of the data detection circuit 161 and the output of the clock detection circuit 162, and outputs the reset signal when both are H. Thus, when the outputs of the data detection circuit 161 and the clock detection circuit 162 are both H, it is reset back to L. Therefore, the UP signal is output over a period of time equal to the phase difference when data comes before the clock signal, and the DOWN signal is output over a period of time equal to the phase difference otherwise. Thus, it is possible to detect how much the phase of the clock signal is ahead of or behind that of the data.

The phase difference detection using such a method can be realized with simple circuits, but it is difficult to use such a phase difference detection in high-speed data communication due to the output delay of flip flop circuits, etc. In order to solve such a problem, Patent Document 1 discloses a method in which the phase difference detection process is parallelized in high-speed data communication.

Patent Document 1 discloses a phase comparator in which the clock frequency of the receiving device is set to 1/(2N+1) (where N is an integer greater than or equal to 1) of the data rate f (f=1/T), and which uses 2N+1 phases of clock signals from the zeroth phase to the $2N^{th}$ phase with a phase difference of T therebetween to perform a parallel process using 2N+1 phase difference detection circuits so as to detect the phase difference between each clock signal and the data.

In the following description, K−1 (K is an integer greater than or equal to 0 and less than or equal to 2N) representing the phase number in a designation "$K-1^{th}$-phase clock signal" is the remainder of division by 2N+1 when it is greater than or equal to 0 and is obtained as K+2N when it is a negative number.

FIG. 24 shows the phase comparator disclosed in Patent Document 1. In this figure, 140 denotes a phase difference detection circuit, 141 a comparison period detection circuit, 142 a window setting circuit, 143 a transition point detection circuit, 144 a reference point detection circuit, 145 a determination circuit, and 146 a delay circuit. The phase comparator includes 2N+1 each of the phase difference detection circuits 140, the comparison period detection circuits 141 and the window setting circuits 142.

The $K^{th}$ comparison period detection circuit 141, i.e., the $K^{th}$(K is an integer from 0 to 2N) one of the 2N+1 comparison period detection circuits, examines the $K^{th}$-phase clock signal and the $(K-1)^{th}$-phase clock signal so as to output a signal indicating a period for comparing the phase of the $K^{th}$-phase clock signal with that of the data when the K-phase clock signal is L and the $(K-1)^{th}$-phase clock signal is H. The $K^{th}$ window setting circuit 142 takes in the output signal of the $K^{th}$ comparison period detection circuit 141 at the rising edge of the data, and holds it until the $(K+1)^{th}$-phase clock signal goes H. This is output as the $K^{th}$ comparison enable signal.

In the phase difference detection circuit 140, the transition point detection circuit 143 outputs the UP signal in synchronism with the rising edge of the data, and the reference point detection circuit 144 outputs the DOWN signal in synchronism with the rising edge of the clock signal. The determination circuit 145 outputs a clear signal that resets both of the outputs of the transition point detection circuit 143 and the reference point detection circuit 144 when the UP signal and the DOWN signal are both H or when the comparison enable signal is L. As a result, the phase difference detection circuit 140 outputs nothing while the comparison enable signal is L, and operates similar to the phase difference detection circuit described above with reference to FIG. 23 when the comparison enable signal goes H.

The $K^{th}$ phase difference detection circuit 140 receives the $K^{th}$ comparison enable signal, data that is delayed by 0.5 T by the delay circuit 146 as the data, and the $K^{th}$-phase clock signal as the clock signal, thereby detecting the phase difference between the 0.5 T-delayed data and the $K^{th}$-phase clock signal and outputting the UP signal or the DOWN signal based on the result only while the $K^{th}$ enable signal is H.

FIG. 25 shows a timing diagram of the phase comparator of Patent Document 1. For the sake of simplicity, only the operation of the first phase difference detection circuit will be described, wherein the period of the clock is assumed to be ⅕ of the data rate.

In this figure, 1501 to 1505 denote zeroth- to fourth-phase clock signals, respectively, 1506 an output signal of the first comparison period detection circuit 141, 1507 a first comparison enable signal, 1508 data, 1509 0.5 T-delayed data, 1510 and 1511 an UP signal and a DOWN signal, respectively, and 1512 a clear signal.

The first comparison period detection circuit 141 outputs the signal 1506 which is L only during a period between the rising edge of the zeroth-phase clock signal 1501 and that of the first-phase clock signal 1502. The first comparison enable signal 1507, which is the output of the first window setting circuit, latches the signal 1506 in synchronism with the rising edge of the data 1508 to output a reverse signal thereof, and is reset when the second clock signal 1503 goes H. Thus, the first comparison enable signal is H if there is a rising edge of the data during a period in which the zeroth-phase clock signal 1501 is H and the first-phase clock signal 1502 is L, and remains L otherwise.

During a period in which the first comparison enable signal 1507 is L, the clear signal 1512 of the first phase difference detection circuit 140 is L, thus resetting the transition point detection circuit 143 and the reference point detection circuit 144. When the first comparison enable signal 1507 goes H, the clear signal 1512 also goes H, thus starting the phase comparison operation. The reference point detection circuit 144 outputs the DOWN signal 1511 in synchronism with the rising edge of the first-phase clock signal 1502, and the transition point detection circuit 143 outputs the UP signal 1510 in synchronism with the rising edge of the 0.5 T-delayed data 1509. Since the figure shows a case where the 0.5 T-delayed data 1509 is lagged behind the first-phase clock signal 1502, the clear signal 1512 output from the determination circuit 145 goes L at a point in time when the UP signal 1510 is output, thus resetting the UP signal 1510 and the DOWN signal 1511 to L. Then, as the UP signal 1510 and the DOWN signal 1511 go L, the clear signal 1512 goes back H.

Thus, data transitions occurring during a period between the rising edge of the zeroth-phase clock signal 1501 and that of the first-phase clock signal 1502 are processed by the first phase difference detection circuit 140 as described above. Data transitions occurring in other periods are similarly processed by corresponding phase difference detection circuits, thus performing a parallel phase comparison process.

Patent Document 1: Japanese Laid-Open Patent Publication No. 2004-15689

DISCLOSURE OF THE INVENTION

Problems to be Solved by the Invention

However, a phase comparator of a configuration as described above has a problem in that the operation is significantly influenced by the precision of the delay circuit for delaying the data by 0.5 T. If the delay value of the delay circuit 146 is accurately 0.5 T, the clock edge will lie at the center of un-delayed data, which is an ideal relationship for latching data with a clock signal. However, if the delay value of the delay circuit 146 contains an error with respect to 0.5 T, the phase of the clock signal converges while being shifted from the center of the un-delayed data by the error. In such a state, the clock signal will latch the data not at the center thereof but at a position closer to the preceding or following transition point, i.e., where the data eye is not sufficiently open, whereby it may not be possible to accurately latch the data if, for example, the clock frequency further increases. Typically, a signal delay circuit is realized by using a gate delay such as an inverter or by varying the signal driving power using an analog method, but these methods are easily influenced by variations in the power supply voltage, the temperature, etc., and it is difficult to realize a delay with a high precision.

Moreover, there is another problem of a deadband. The phase difference detection circuit 140 starts operating when the comparison enable signal goes H. In fact, however, there is a deadband until the determination circuit 145 transitions the clear signal from L to H to cancel the reset of the transition point detection circuit 143 and the reference point detection circuit 144. The transition point detection circuit 143 is not influenced by the deadband since the input data is sufficiently (by about 0.5 T) delayed with respect to the rise of the comparison enable signal, but the reference point detection circuit 144 is influenced by the deadband depending on the timing. Influence of a deadband includes a case where the clear signal is not canceled in time for the clock input to the reference point detection circuit 144. In such a case, the UP signal will be output, where the DOWN signal should be output over a length of time according to the phase difference, thus resulting in the phase comparison result itself being wrong. An object of the present invention is to provide a phase comparator capable of stably performing a phase comparison process against variations in the power supply voltage, the temperature, etc., without requiring high-precision delay means.

Means for Solving the Problems

In order to achieve the object set forth above, the present invention performs, in parallel, a phase comparison process and a process of determining whether the data edge lies within a window so that the phase comparison result is output only if the data edge lies within the window.

Specifically, a phase comparator of the present invention is a phase comparator for use in clock data recovery means for performing phase regulation and receiving data by using 2N+1 phases of clock signals whose period is (2N+1)T (N is an integer greater than or equal to 1) and whose phase difference is 1 T in data communication where a data rate is 1/T bps, the phase comparator including: 2N+1 comparison period detection means each for determining whether it is within an $m^{th}$ comparison period, which is defined as a period between a rising edge of a first clock signal and a rising edge of a second clock signal, to output the determination result as an $m^{th}$ comparison enable signal, wherein the first clock signal is the $(m-1)^{th}$-phase (m−1 is a remainder of division by 2N+1 when it is greater than or equal to 0 and is obtained as m+2N when it is a negative number) clock signal among the 2N+1 phases of clock signals, and the second clock signal is the $m^{th}$-phase (m is an integer greater than or equal to 0 and less than or equal to 2N) clock signal; and 2N+1 phase difference detection means each for receiving the $m^{th}$ comparison enable signal, the data and a reference clock to output information on a phase difference between the reference clock and the data when the $m^{th}$ comparison enable signal is active, wherein the reference clock is the $(N+m)^{th}$-phase (N+m is a remainder of division by 2N+1) clock signal.

Another phase comparator of the present invention is a phase comparator for use in clock data recovery means for performing phase regulation and receiving data by using 2N phases of clock signals whose period is NT (N is an integer greater than or equal to 1) and whose phase difference is 0.5 T in data communication where a data rate is 1/T bps, the phase comparator including: N comparison period detection means each for determining whether it is within an $m^{th}$ comparison period, which is defined as a period between a rising edge of a first clock signal and a rising edge of a second clock signal, to output the determination result as an $m^{th}$ comparison enable signal, wherein the first clock signal is the $(2m-2)^{th}$-phase ($2m-2$ is a remainder of division by 2N when it is greater than or equal to 0 and is obtained as 2m+2N−2 when it is a negative number) clock signal among the 2N phases of clock signals, and the second clock signal is the $2m^{th}$-phase (m is an integer greater than or equal to 0 and less than or equal to N−1) clock signal; and N phase difference detection means each for receiving the $m^{th}$ comparison enable signal, the data and a reference clock to output information on a phase difference between the reference clock and the data when the $m^{th}$ comparison enable signal is active, wherein the reference clock is the $(2m-1)^{th}$-phase ($2m-1$ is a remainder of division by 2N when it is greater than or equal to 0 and is obtained as $2m+2N-1$) clock signal.

The present invention also provides a phase comparator as set forth above, wherein: the comparison period detection means outputs a comparison enable signal by determining whether a transition point of a data signal has occurred within the comparison period; and the phase difference detection means includes: reference point detection means for detecting an edge of the reference clock to output the detection result as a DOWN signal; transition point detection means for detecting a transition point of the data signal to output the detection result as an UP signal; determination means for receiving the UP signal to determine whether there is a data transition point within the comparison period; delay means for delaying each of the UP signal and the DOWN signal; and masking means for allowing an output of the delay means to pass therethrough when there is a transition of data and masking the output of the delay means when there is no transition of data, based on an output of the determination means.

The present invention also provides a phase comparator as set forth above, wherein: the comparison period detection means activates the comparison enable signal while the first clock signal is H and the second clock signal is L; when the transition point detection means detects a transition point of the data signal within the comparison period, the transition point detection means holds and outputs the detection result as the UP signal, and the transition point detection means resets the stored content thereof when receiving a clear signal output from the determination means; the reference point detection means detects a clock edge that is present within the comparison period to hold and output the detection result as the DOWN signal, and resets the stored content thereof when receiving the clear signal output from the determination means; the determination means outputs a comparison completion signal when both of the UP signal and the DOWN signal are output, and further outputs the clear signal when either a reset signal or the comparison completion signal is output, wherein the reset signal is given at a predetermined point in time between when a delay value defined by the delay means elapses since a rising edge of the $m^{th}$-clock signal and a next rising edge of the first clock signal; and the masking means stops masking an output of the delay means when the comparison completion signal is output, and starts masking the output when the reset signal is output.

The present invention also provides a phase comparator as set forth above, wherein: the comparison period detection means activates the comparison enable signal while the first clock signal is H and the second clock signal is L; when the transition point detection means detects a transition point of the data signal within the comparison period, the transition point detection means holds and outputs the detection result as the UP signal, and the transition point detection means resets the stored content thereof when receiving a reset signal, wherein the reset signal is given at a predetermined point in time between when a delay value defined by the delay means elapses since a rising edge of the second clock signal and a next rising edge of the first clock signal; the reference point detection means detects a clock edge of the reference clock that is present within the comparison period to hold and output the detection result as the DOWN signal, and resets the stored content thereof when receiving the reset signal; the determination means outputs a signal being output as it is when either the UP signal or the DOWN signal is output, and stops its output otherwise; and the masking means masks an output of the delay means when the transition point detection means is not outputting the UP signal.

The present invention also provides a phase comparator as set forth above, wherein: the comparison period detection means holds the first clock signal and the second clock signal at a transition point of the data signal, is reset at a predetermined point in time between when a period of time necessary for an output of the determination means to settle elapses since a rising edge of the second clock signal and a next rising edge of the first clock signal, and outputs the comparison enable signal when the result of holding the first clock signal is H and the result of holding the second clock signal is L; when the transition point detection means detects a transition point of the data signal, the transition point detection means holds and outputs the detection result as the UP signal, and the transition point detection means resets the stored content thereof when receiving a clear signal output from the determination means; when the reference point detection means detects a clock edge of the reference clock, the reference point detection means holds and outputs the detection result as the DOWN signal, and the reference point detection means resets the stored content thereof when receiving the clear signal output from the determination means; the determination means outputs a comparison completion signal when all of the UP signal, the DOWN signal and the comparison enable signal are output, and further outputs the clear signal when a reset signal is received, when the comparison completion signal is output or when the masking means has stopped a masking stop signal, wherein the reset signal is output at a predetermined point in time after a delay value defined by the delay means elapses since a rising edge of the second clock signal, and the reset signal is stopped at a predetermined point in time within a period of a length T immediately before a next rising edge of the first clock signal; and the masking means outputs the masking stop signal to stop masking the output of the delay means when the comparison completion signal is output, and stops the masking stop signal to start masking the output when the reset signal is output.

The present invention also provides a phase comparator as set forth above, wherein the masking means outputs the masking stop signal when the comparison completion signal is output, stops the masking stop signal when the reset signal is output, so as to stop the masking process during a period in which the comparison enable signal is output while performing the masking process during other periods.

The present invention also provides a phase comparator as set forth above, wherein: the comparison period detection means holds the first clock signal and the second clock signal at a transition point of the data signal, resets the stored content thereof when a reset signal is received, and outputs a comparison enable signal when the result of holding the first clock signal is H and the result of holding the second clock signal is L, wherein the reset signal is output at a predetermined point in time after a delay value defined by the delay means elapses since a rising edge of the second clock signal, and the reset signal is stopped at a predetermined point in time within a period of a length T immediately before a next rising edge of the first clock signal; when the transition point detection means detects a transition point of the data signal, the transition point detection means holds and outputs the detection result as the UP signal, and the transition point detection means resets the stored content thereof when receiving the reset signal; the reference point detection means detects a clock edge that is present within the comparison period to hold and output the detection result as the DOWN signal, and resets the stored content thereof when receiving the reset signal; the determination means outputs a signal being output as it is when either the UP signal or the DOWN signal is output, and stops its output otherwise; and the masking means allows an output of the delay means to pass therethrough when the transition point detection means outputs the UP signal and the comparison enable signal is output, and masks the output otherwise.

The present invention also provides a phase comparator as set forth above, wherein: the comparison period detection means activates the comparison enable signal based on a state of the first clock signal and a state of the second clock signal at a transition point of a data signal; and the phase difference detection means includes: reference point detection means for detecting an edge of the reference clock to output the detection result as a DOWN signal; determination means for receiving the comparison enable signal to determine whether there is a data transition point within the comparison period; delay means for delaying each of the comparison enable signal and the DOWN signal; and masking means for allowing an output of the delay means to pass therethrough when there is a transition of data and masking the output of the delay means when there is no transition of data, based on an output of the determination means.

The present invention also provides a phase comparator as set forth above, wherein: the comparison period detection means holds the first clock signal and the second clock signal at a transition point of the data signal, is reset when a clear signal output from the determination means is received, and outputs a comparison enable signal when the result of holding the first clock signal is H and the result of holding the second clock signal is L; when the reference point detection means detects a clock edge of the reference clock, the reference point detection means holds and outputs the detection result as the DOWN signal, and the reference point detection means resets the stored content thereof when receiving the clear signal; the determination means outputs a comparison completion signal when both of the comparison enable signal and the DOWN signal are output, and further outputs the clear signal when a reset signal is received, when the comparison completion signal is output or when the masking means has stopped a masking stop signal, wherein the reset signal is given at a predetermined point in time between when a delay value defined by the delay means elapses since a rising edge of the second clock signal and a next rising edge of the first clock signal; and the masking means outputs the masking stop signal to stop masking the output of the delay means when the comparison completion signal is output, and stops the masking stop signal to start masking the output when the reset signal is output.

The present invention also provides a phase comparator as set forth above, wherein: the comparison period detection means holds the first clock signal and the second clock signal at a transition point of the data signal when the comparison enable signal is not output, is reset when a reset signal is received, and outputs a comparison enable signal when the result of holding the first clock signal is H and the result of holding the second clock signal is L, wherein the reset signal is given at a predetermined point in time between when a delay value defined by the delay means elapses since a rising edge of the second clock signal and a next rising edge of the first clock signal; when the reference point detection means detects a clock edge of the reference clock, the reference point detection means holds and outputs the detection result as the DOWN signal, and the reference point detection means resets the stored content thereof when receiving the reset signal; the determination means outputs a signal being output as it is when either the comparison enable signal or the DOWN signal is output, and stops its output otherwise; and the masking means allows an output of the delay means to pass therethrough when the comparison enable signal is output, and masks the output otherwise.

The present invention also provides a phase comparator as set forth above, wherein: the masking means is data holding means for holding and outputting a signal input to a data input pin thereof based on a signal input to a clock input pin thereof, and resetting the stored content thereof based on a signal input to a reset input pin thereof; and the comparison completion signal is input to the reset input pin, the data input pin is fixed to a power supply voltage, and a reset signal is input to the clock input pin, wherein the reset signal is output at a predetermined point in time after a delay value defined by the delay means elapses since a rising edge of the second clock signal, and the reset signal is canceled at a predetermined point in time before a next rising edge of the first clock signal.

The present invention also provides a phase comparator as set forth above, wherein the comparison period detection means holds the first clock signal and the second clock signal at a transition point of the data signal, and outputs a comparison enable signal when the UP signal is output, the result of holding the first clock signal is H and the result of holding the second clock signal is L.

The present invention also provides a phase comparator as set forth above, wherein a delay value of the delay means is greater than or equal to 0.5 T and less than the period of the clock signal minus 0.5 T.

The present invention also provides a phase comparator as set forth above, wherein: the comparison period detection means outputs a comparison enable signal by determining whether a transition point of a data signal has occurred within the comparison period; and the phase difference detection means includes: delay means for delaying each of the data signal and the reference clock; reference point detection means for detecting an edge of the delayed reference clock to output the detection result as a DOWN signal; transition point detection means for detecting a transition point of the delayed data signal to output the detection result as an UP signal; determination means for receiving the UP signal and the DOWN signal to determine a state of a phase difference detection process; masking means for starting the output of the UP signal and the DOWN signal based on the comparison enable signal, and stopping the output of the UP signal and the DOWN signal based on an output of the determination means.

The present invention also provides a phase comparator as set forth above, wherein: the comparison period detection means holds the first clock signal and the second clock signal at a transition point of the data signal, outputs a comparison enable signal when the result of holding the first clock signal is H and the result of holding the second clock signal is L, and is reset at a predetermined point in time between when a period of time necessary for the comparison enable signal to settle elapses since a transition point of the data signal and a next rising edge of the first clock signal; the delay means delays the data signal, the reference clock and a reset signal to output a delayed data signal, a delay reference clock and a delayed reset signal, respectively, wherein the reset signal is output at a predetermined point in time after a delay value defined by the delay means elapses since a rising edge of the second clock signal, and the reset signal is stopped at a predetermined point in time within a period of a length T immediately before a next rising edge of the first clock signal; when the transition point detection means detects a transition point of the delayed data signal, the transition point detection means holds and outputs the detection result as the UP signal, and the transition point detection means resets the stored content thereof when receiving a clear signal output from the determination means; when the reference point detection means detects a clock edge of the delay reference clock, the reference point detection means holds and outputs the detection result as the DOWN signal, and the reference point detection means resets the stored content thereof when receiving a clear signal output from the determination means; the determination means outputs a comparison completion signal when both of the UP signal and the DOWN signal are output, and further outputs the clear signal when the delayed reset signal is received or when the comparison completion signal is output; and the masking means starts masking the UP signal and the DOWN signal when the comparison completion signal is output, and stops the masking to allow the UP signal and the DOWN signal to pass therethrough when the comparison enable signal is output.

A phase regulation circuit of the present invention is a phase regulation circuit in data communication where a data rate is 1/T bps, including: a VCO for outputting N phases of clock signals whose phase difference is 1/N (N is an integer greater than or equal to 1) of an oscillation frequency thereof; the phase comparator of claim 3 or 6, to which the N phases of clock signals and received data are input; a charge pump for controlling a current based on an UP signal and a DOWN signal, which are output from the phase comparator; and a low pass filter for converting an output current from the charge pump to a voltage, wherein the oscillation frequency of the VCO is controlled based on the output voltage from the low pass filter.

Another phase regulation circuit of the present invention is a phase regulation circuit in data communication where a data rate is 1/T bps, including: a PLL whose oscillation frequency is NT (N is an integer greater than or equal to 1); a DLL for delaying an output clock from the PLL; a delay line for receiving an output from the DLL to output N phases of clock signals whose phases are shifted from one another by T; the phase comparator of claim 3 or 6, to which the N phases of clock signals and received data are input; a charge pump for controlling a current based on an UP signal and a DOWN signal, which are output from the phase comparator; and a low pass filter for converting an output current from the charge pump to a voltage, wherein the delay value of the DLL is controlled based on the output voltage from the low pass filter.

Thus, according to the present invention, the phase comparison and the process of determining whether a data edge lies within a window are performed in parallel to each other. Therefore, where the clock frequency is 1/5 of the data rate f (=1/T), for example, there are five phases of clock signals from the zeroth phase to the fourth phase with a phase difference of T therebetween, and the delay time in the delay means can be set freely within the range of 3 T. Therefore, as compared with a case where the delay means introduces a delay of 0.5 T precisely, as with conventional techniques, it is possible to perform a stable phase comparison process against variations in the power supply voltage or the temperature, without requiring high-precision delay means.

Moreover, by monitoring the UP signal, it is possible to determine whether a data transition point, which is not synchronized with the comparison period, has been properly latched and whether the phase comparison has been performed normally. In a case where the phase comparison has not been performed normally, the output of the phase difference detection means can be stopped, thus realizing an accurate phase comparison with no errors.

EFFECTS OF THE INVENTION

As described above, according to the present invention, it is possible to perform a stable phase comparison against variations in the power supply voltage or the temperature, without requiring high-precision delay means.

Moreover, there is a significant advantage in that in a case where the phase comparison has not been performed normally, the output of phase difference detection means can be stopped, thus realizing an accurate phase comparison with no errors.

BRIEF DESCRIPTION OF THE DRAWINGS

FIG. 3a shows an operation diagram of the phase difference detection circuit for a case where there is a data transition.

DESCRIPTION OF REFERENCE NUMERALS

Figure 1:
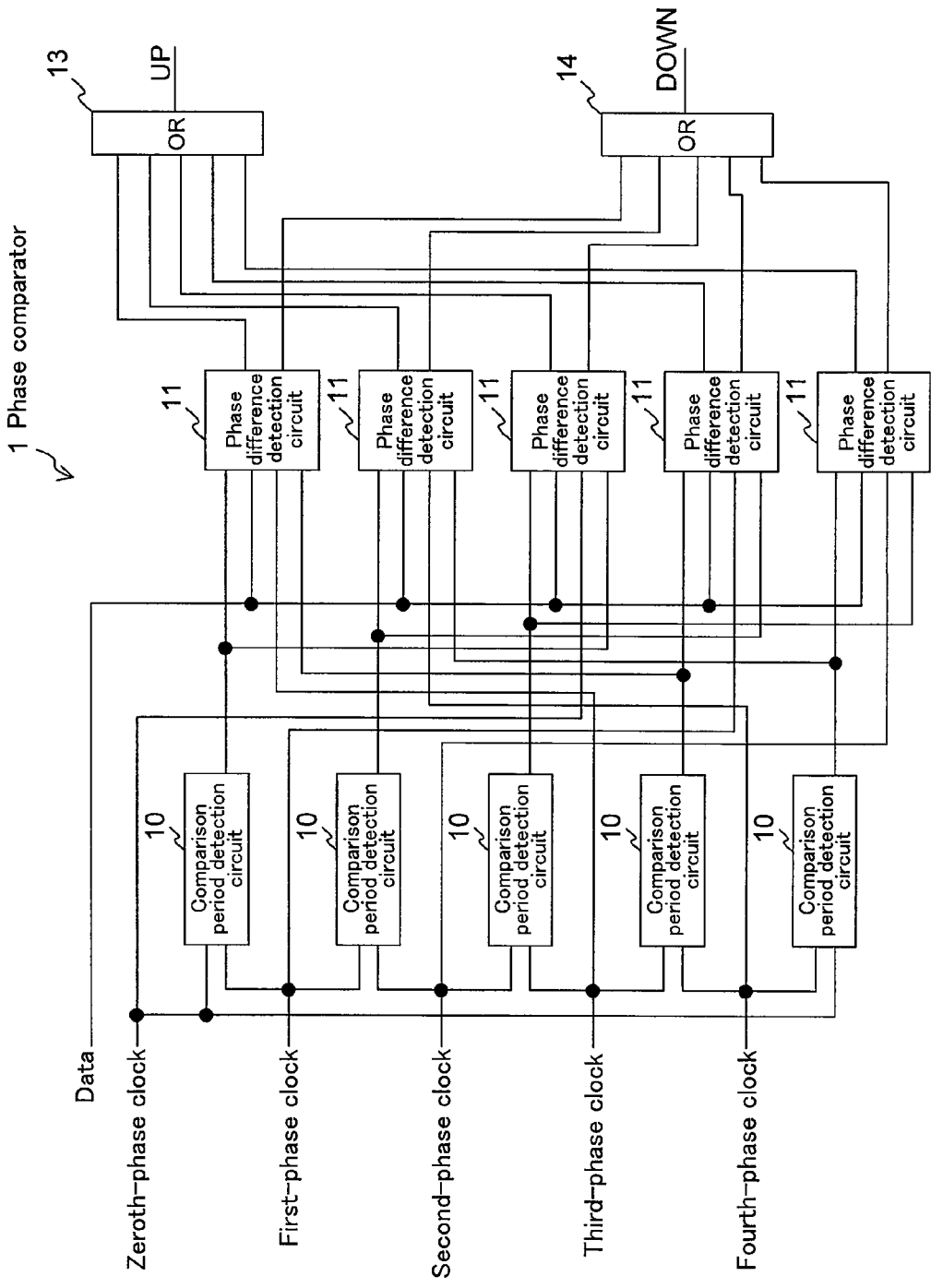
FIG. 1 shows a general configuration of a phase comparator according to first and second embodiments of the present invention.

1 Phase comparator
2 Charge pump
3 Low pass filter
4 VCO
5 PLL
6 DLL
7 Delay line
10 Comparison period detection circuit (comparison period detection means)
11 Phase difference detection circuit (phase difference detection means)
12 Reset generation circuit
13 First logical sum circuit
14 Second logical sum circuit
41, 61, 81, 101 Transition point detection circuit (transition point detection means)
42, 62, 82, 102 Reference point detection circuit (reference point detection means)
43, 63, 83, 103 Determination circuit (determination means)
44, 64, 84, 104 Delay circuit (delay means)
45, 65, 85, 105 Masking circuit (masking means)
141 Comparison period detection circuit
142 Window setting circuit
143 Transition point detection circuit
144 Reference point detection circuit
145 Determination circuit
146 Delay circuit

BEST MODE FOR CARRYING OUT THE INVENTION

Phase comparators according to embodiments of the present invention will now be described with reference to the drawings.

The phase comparators to be described below are those for clock data recovery means used in data communication where the data rate is 1/T bps for regulating the phase and receiving data by using (2N+1) phases of clock signals whose period is (2N+1)T (N is an integer greater than or equal to 1) and whose phase difference is 1 T. For the sake of simplicity, configurations where N=2 and the clock frequency is ⅕ of the data rate f (f=1/T) will be described below. Each number denoted as "m−1" in the following description represents the remainder of division by 5 when m−1 is greater than or equal to 0 and m+4 when m−1 is a negative number.

First Embodiment

FIG. 1 shows a phase comparator according to a first embodiment of the present invention. The present embodiment corresponds to claims 1, 3 and 4.

In the figure, 1 denotes a phase comparator, 10 a comparison period detection circuit, 11 a phase difference detection circuit, 13 a first logical sum circuit, and 14 a second logical sum circuit.

Since the clock frequency is ⅕ of the data rate f (5=2N+1, N=2), there are five phases of clock signals, and the phase comparator 1 includes five (zeroth to fourth) each of the comparison period detection circuits (comparison period detection means) 10 and the phase difference detection circuits (phase difference detection means) 11.

The $m^{th}$ comparison period detection circuit 10 (m is an integer from 0 to 2N (=4) or less) receives the $(m-1)^{th}$-phase clock signal as the first clock and the $m^{th}$-clock signal as the second clock to output the $m^{th}$ comparison enable signal.

The $m^{th}$ phase difference detection circuit 11 receives the $m^{th}$ comparison enable signal, the data, the $(m+2)^{th}$-phase clock signal as the reference clock, and the $(m+3)^{th}$ comparison enable signal as the reset signal to output the mh UP signal and the $m^{th}$ DOWN signal.

The first logical sum circuit 13 obtains the logical sum of the UP signals output from the phase difference detection circuits, and the second logical sum circuit obtains the logical sum of the DOWN signals, which are output as the phase comparison result of the phase comparator 1.

As can be seen from the configuration, each of the five phase difference detection circuits 11 operates only once in five cycles of the data rate f, thus realizing a parallel phase comparison process.

Figure 2:
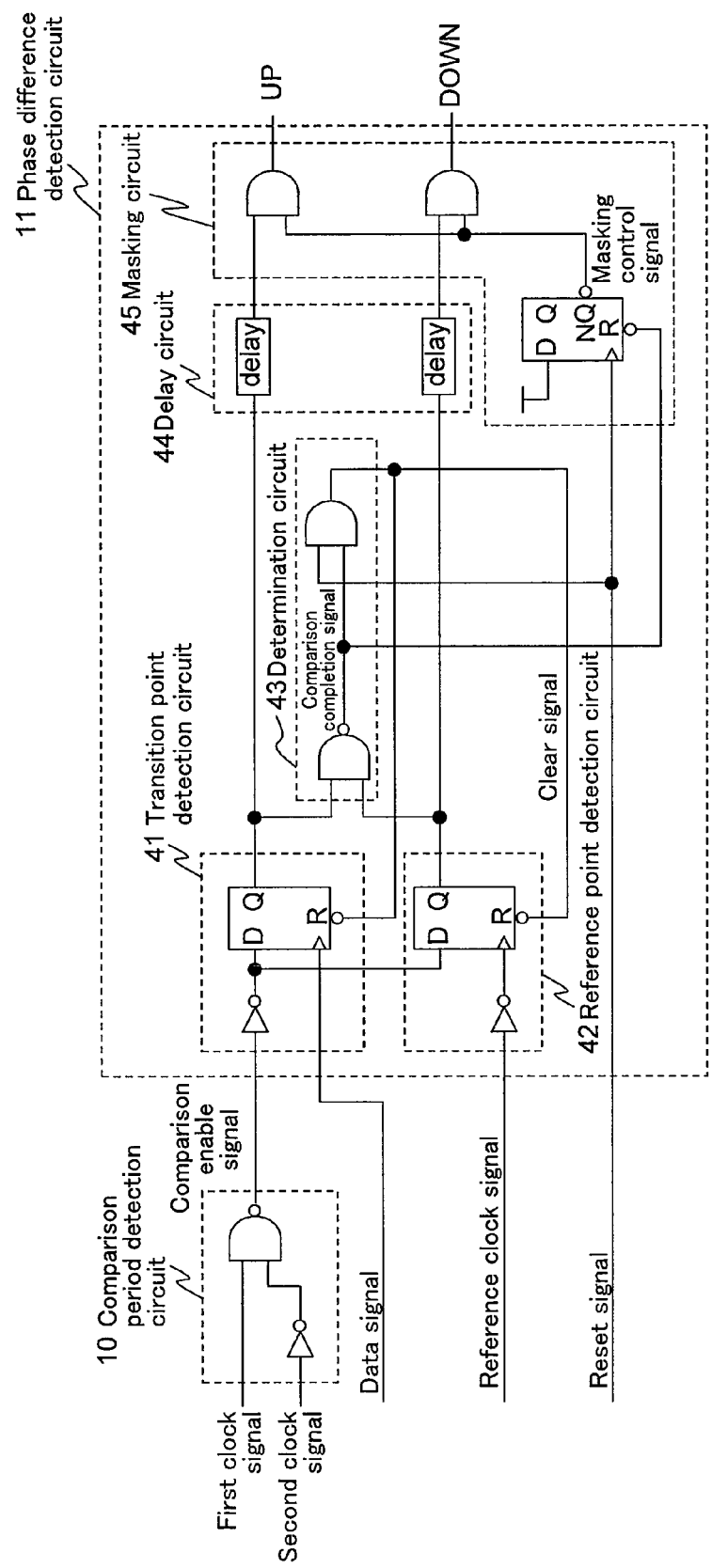
FIG. 2 shows a configuration of a phase difference detection circuit provided in the phase comparator.

FIG. 2 shows a configuration of the comparison period detection circuit 10 and the phase difference detection circuit 11. In the figure, 41 denotes a transition point detection circuit, 42 a reference point detection circuit, 43 a determination circuit, 44 a delay circuit, and 45 a masking circuit.

The comparison period detection circuit 10 outputs L as the comparison enable signal during a period in which the first clock is H and the second clock is L, outputting H during other periods.

The transition point detection circuit (transition point detection means) 41 is a flip flop circuit that holds the reverse signal of the comparison enable signal in synchronism with the rising edge of the data signal, and turns the stored content to L when receiving the clear signal. The reference point detection circuit (reference point detection means) 42 is a flip flop circuit that holds the reverse signal of the comparison enable signal in synchronism with the falling edge of the reference clock, and turns the stored content to L when receiving the clear signal.

The determination circuit (determination means) 43 keeps the comparison completion signal at L during a period in which the output of the transition point detection circuit 41 and the output of the reference point detection circuit 42 are both H, and keeps the clear signal at L during that period and during a period in which the reset signal is L.

The delay circuit (delay means) 44 delays the output of the transition point detection circuit 41 and the output of the reference point detection circuit 42.

The masking circuit (masking means) 45 includes a flip flop circuit (data holding circuit) that outputs, as the masking control signal, H during a period in which the comparison completion signal is L, and L in synchronism with the rising edge of the reset signal during other periods, and allows the output signal of the delay circuit 44 to pass therethrough only during a period in which the masking control signal is H, outputting L in other periods.

FIG. 3 shows a timing diagram of the operation of the first (m=1) comparison period detection circuit and the first phase difference detection circuit. The phase comparison operation will now be described with reference to FIGS. 2 and 3.

With the configuration of the phase comparator shown in FIG. 1, the first clock signal and the second clock signal shown in FIG. 2 correspond respectively to the zeroth-phase clock ("0" being the remainder of division by 2N+1 (=5) where m−1=0) and the first-phase clock (m=1) in FIG. 3. the reference clock signal in FIG. 2 is the third-phase clock ("3" being the remainder of division by 5 where N+m=3) in FIG. 3, and the reset signal in FIG. 3 is the fourth comparison enable signal output from the fourth comparison period detection circuit.

First, a case where there is a data transition point within the comparison period will be described with reference to FIG. 3(a).

The comparison period detection circuit 10 examines a zeroth-phase clock 500 and a first-phase clock 501 to output L as the first comparison enable signal 505 during a period in which the zeroth-phase clock 500 is H and the first-phase clock 501 is L. This period is referred to as the first comparison period. During other periods, the comparison enable signal 505 outputs H.

In the phase difference detection circuit 11, the transition point detection circuit 41 and the reference point detection circuit 42 latch and output the reverse signal of the first comparison enable signal 505 at the transition point of data 507 and at the transition point of the reference clock 503, respectively. In FIG. 3, since the falling edge of the reference clock 503 precedes the rising edge of the data 507, the reference point detection circuit first turns an output signal 509 to H in synchronism with the falling edge of the reference clock 503. Then, the transition point detection circuit 41 turns an output signal 508 to H in synchronism with the rising edge of the data 507. The output signal 508 of the transition point detection circuit 41 and the output signal 509 of the reference point detection circuit 42 are both input to the determination circuit 43 and to the delay circuit 44.

The determination circuit 43 constantly monitors the output signal 508 of the transition point detection circuit 41 and the output signal 509 of the reference point detection circuit 42, and transitions a comparison completion signal 510 to L at a point in time when both of the signals go H. As a result, the clear signal also goes L, thus resetting the outputs 508 and 509 of the transition point detection circuit 41 and the reference point detection circuit 42 to L and turning the comparison completion signal back to H.

The delay circuit 44 delays each of the outputs 508 and 509 of the transition point detection circuit 41 and the reference point detection circuit 42 by 1 T. Note however that the delay value of the delay circuit 44 is not limited to 1 T, and may be set within the range of 0.5 T or more and up to 0.5 T before a masking control signal 511 is reset to L. Since the description herein assumes the use of the phase comparator having a configuration as shown in FIG. 1, it may be set within the range of 0.5 T or more and 3 T or less. 5 T is a preparatory period for the next phase regulation.

In the masking circuit 45, when the comparison completion signal 510 goes L, the masking control signal 511 goes H to stop masking the output of the delay circuit 44. Thus, until the masking control signal 511 goes back L at the rising edge of a reset signal 506, the output signals of the delay circuit 44 are output, as they are, as a first UP signal 512 and a first DOWN signal 513 being the result of the process of the first phase difference detection circuit.

Figure 3B:
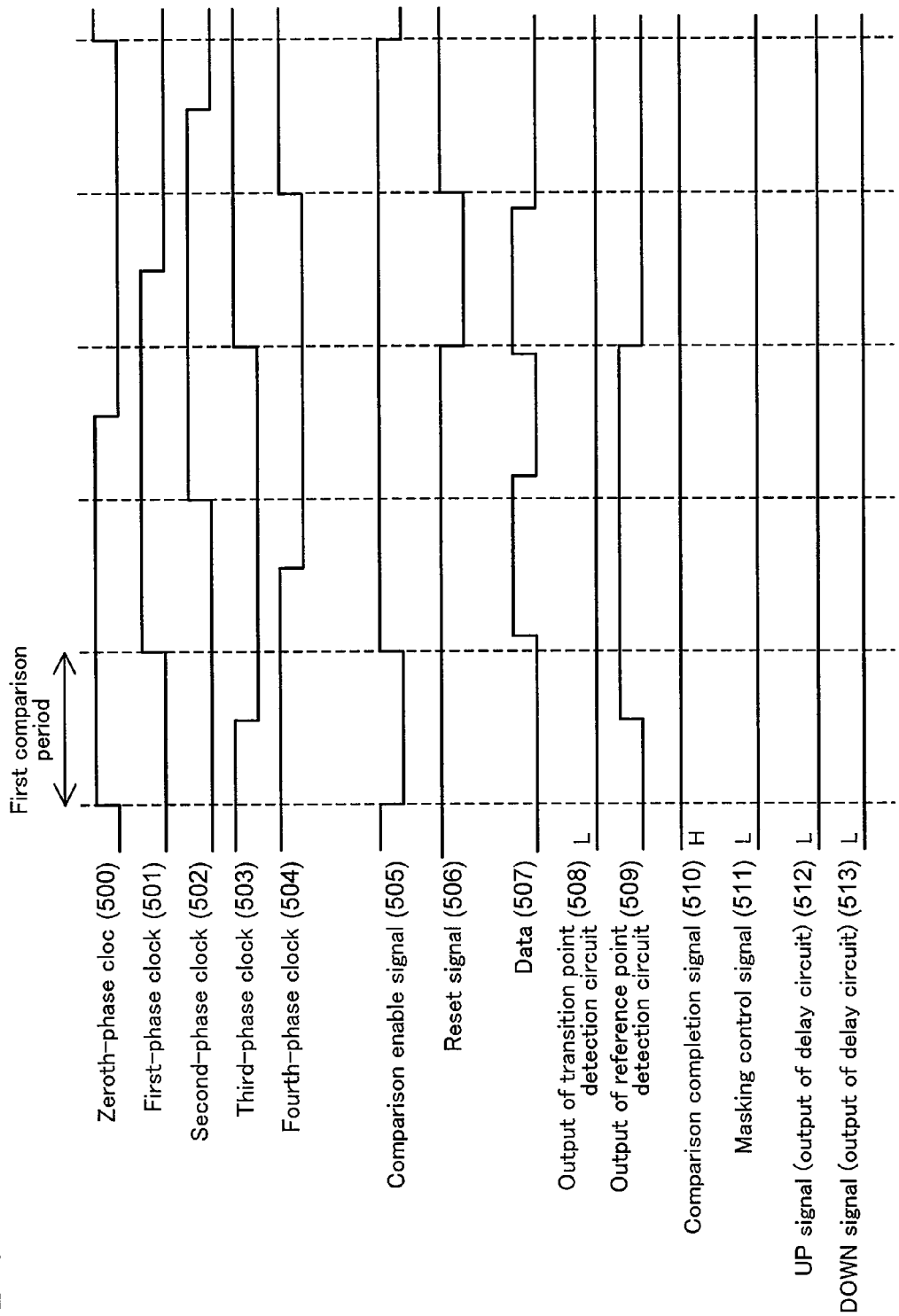
FIG. 3b shows an operation diagram of the phase difference detection circuit for a case where there is no data transition.

Next, a case where there is no data transition point within the comparison period will be described with reference to FIG. 3(b).

In the transition point detection circuit 41, since there is no rising edge of the data 507 during a period in which the comparison enable signal 505 is L, the output 508 thereof remains unchanged at L. In the reference point detection circuit 42, since there is a falling edge of the reference clock 503 in the middle point of the period in which the comparison enable signal 505 is L, the output 509 thereof goes H at this point in time. However, the comparison completion signal 510 remains unchanged at H, and therefore the masking control signal 511 is also kept at L, whereby the masking circuit 45 masks the output of the delay circuit 44. Therefore, the first UP signal 512 and the first DOWN signal 513, being the outputs of the first phase difference detection circuit, remain at L. With the comparison completion signal 510 not going L, the output of the reference point detection circuit 42 is reset to L at a point in time when the reset signal 506 goes L.

As described above, the phase difference detection circuit 11 performs a phase comparison process for a data transition point within a predetermined comparison period. Only the operation of the first phase difference detection circuit 11 has been described above, the other phase difference detection circuits operate similarly.

The first logical sum circuit 13 produces the logical sum of the zeroth to fourth UP signals obtained as described above to output the logical sum as the UP signal of the phase comparator 1, whereas the second logical sum circuit 14 produces the logical sum of the zeroth to fourth DOWN signals to output the logical sum as the DOWN signal of the phase comparator 1. Data phase comparison is performed through such a process.

Second Embodiment

Figure 4:
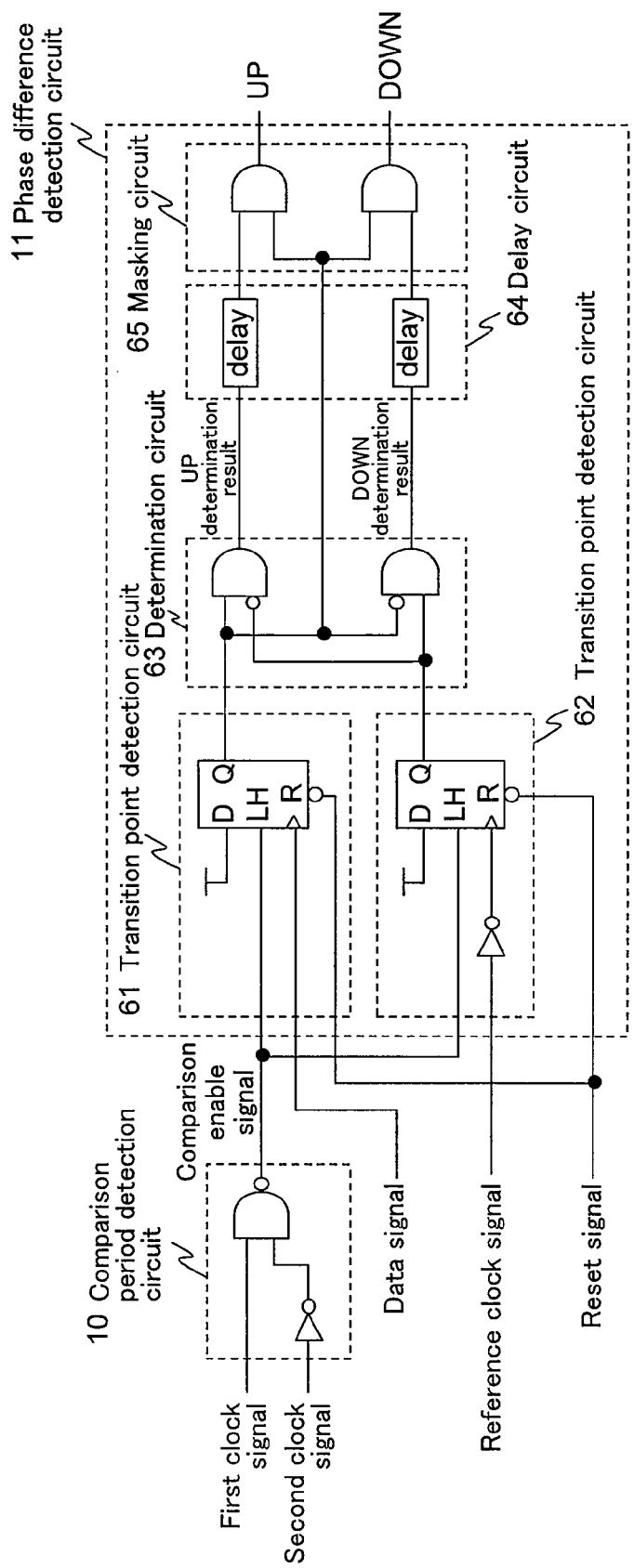
FIG. 4 shows a configuration of a phase difference detection circuit provided in the phase comparator according to the second embodiment of the present invention.

FIG. 4 shows the phase difference detection circuit 11 of a second embodiment for use in the phase comparator 1 shown in FIG. 1. The present embodiment corresponds to claim 5.

In the figure, 61 denotes a transition point detection circuit, 62 a reference point detection circuit, 63 a determination circuit, 64 a delay circuit, and 65 a masking circuit.

As in the first embodiment, the comparison period detection circuit 10 outputs L as the comparison enable signal during a period in which the first clock is H and the second clock is L, and outputs H during other periods.

The transition point detection circuit 61 is a flip flop circuit that holds H in synchronism with the rising edge of the data signal only during a period in which the comparison enable signal is L, keeps holding the value during a period in which the comparison enable signal is H, and turns the stored content to L when receiving the clear signal.

The transition point detection circuit 62 is a flip flop circuit that holds H in synchronism with the falling edge of the reference clock only during a period in which comparison enable signal is L, keeps holding the value during a period in which the comparison enable signal is H, and turns the stored content to L when receiving the clear signal.

The determination circuit 63 masks the output of the reference point detection circuit 62 when the output of the transition point detection circuit 61 is H, and masks the output of the transition point detection circuit 61 when the output of the reference point detection circuit 62 is H.

The delay circuit 64 delays the outputs of the determination circuit 63 by the same amount. The masking circuit 65 allows the output of the delay circuit 64 to pass therethrough during a period in which the output of the transition point detection circuit 61 is H, and masks the output to L during other periods.

Figure 5:
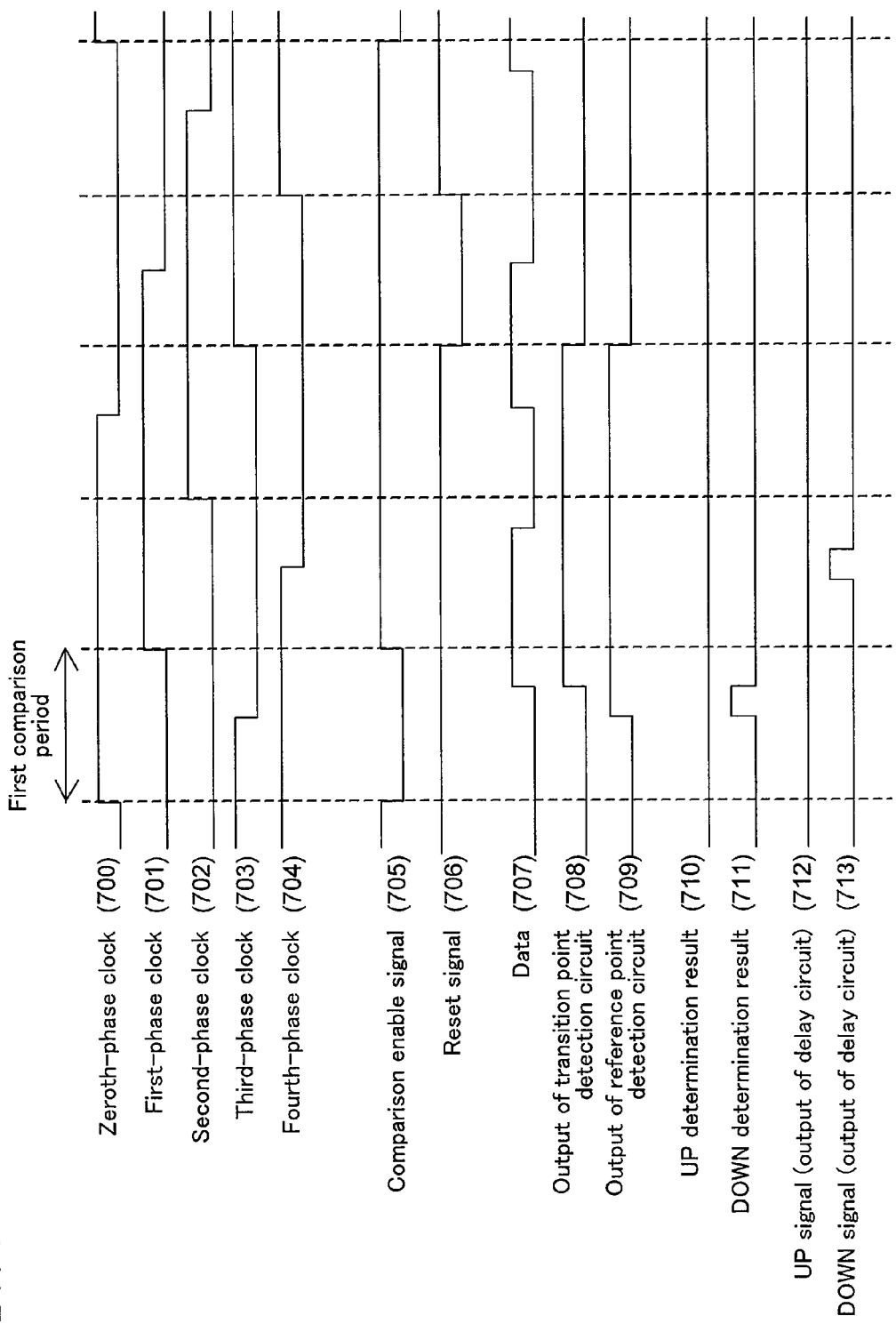
FIG. 5 shows an operation diagram of the phase difference detection circuit.

FIG. 5 shows a timing diagram of the operation of the first comparison period detection circuit and the first phase difference detection circuit shown in FIG. 4. The phase comparison operation will now be described with reference to FIGS. 4 and 5.

As in the first embodiment, the first clock signal and the second clock signal in FIG. 4 correspond respectively to the zeroth-phase clock and the first-phase clock in FIG. 5. The reference clock signal in FIG. 4 is the third-phase clock in FIG. 5, and the reset signal in FIG. 5 is the fourth comparison enable signal output from the fourth comparison period detection circuit.

The comparison period detection circuit 10 examines a zeroth-phase clock 700 and a first-phase clock 701 to output L as the first comparison enable signal 705 during a period in which the zeroth-phase clock 700 is H and the first-phase clock 701 is L. During other periods, the comparison enable signal 705 outputs H.

The transition point detection circuit 61 turns an output 708 to H when there is a transition point of data 707 during a period in which the comparison enable signal 705 is L. Similarly, the reference point detection circuit 62 outputs H when there is a transition point of the reference clock 703 during a period in which the comparison enable signal 705 is L. In FIG. 5, since the falling edge of the reference clock 703 precedes the data 707 during a period in which the comparison enable signal 705 is L, the reference point detection circuit 62 outputs H in synchronism with the falling edge of the reference clock 703. Then, the transition point detection circuit 61 outputs H in synchronism with the rising edge of the data 707.

The determination circuit 63 constantly monitors an output signal 708 of the transition point detection circuit 61 and an output signal 709 of the reference point detection circuit 62, wherein when one of the signals goes H, the other is masked to L. Thus, the preceding output 709 of the reference point detection circuit 62 is output as a DOWN determination result 711. Then, an UP determination result 710, being the other output of the determination circuit 63, is masked to L by the DOWN determination result 711. Then, when the transition point detection circuit 61 starts outputting H, the DOWN determination result 711 is also masked to L, thereby forming a pulse whose width is equal to the phase difference between the data 707 and the reference clock 703.

The delay circuit 64 delays each of the UP determination result 710 and the DOWN determination result 711 by 1 T.

The masking circuit 65 allows the outputs 712 and 713 of the delay circuit 64 to pass therethrough during a period in which the output signal 708 of the transition point detection circuit 61 is H, and masks the outputs to L during other periods. The outputs of the masking circuit 65 are, as they are, used as the first UP signal and the first DOWN signal, which are output as the processing result of the first phase difference detection circuit.

Figure 6:
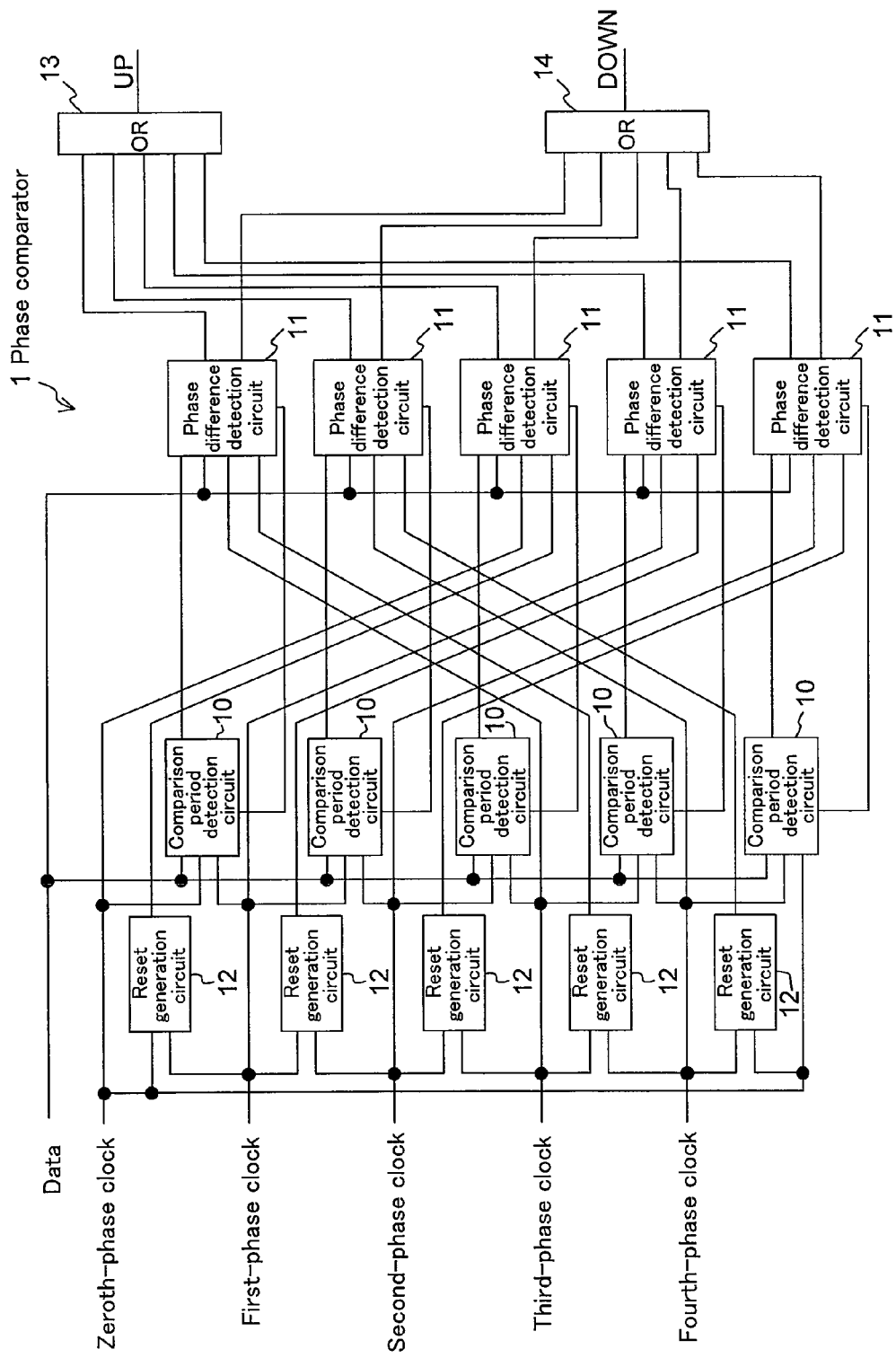
FIG. 6 shows a general configuration of a phase comparator according to third and fourth embodiments of the present invention.

As can be seen from such an operation, the delay value of the delay circuit 64 of FIG. 6 is not limited to 1 T, and may be set within the range of 0.5 T or more and up to 0.5 T before the output 708 of the transition point detection circuit 61 is reset. Since the description herein assumes the use of the phase comparator having a configuration as shown in FIG. 1, it may be set within the range of 0.5 T or more and 2 T or less.

The description above has been directed to an operation where there is a data transition point within the comparison period. In a case where there is no data transition point within the comparison period, the comparison enable signal remains at H, and therefore the transition point detection circuit 61 and the reference point detection circuit 62 keep holding L, whereby there will be no change of state and the output of the first phase difference detection circuit will remain at L.

Third Embodiment

FIG. 6 shows a phase comparator according to a third embodiment of the present invention. The present embodiment corresponds to claims 6 and 7.

In the figure, 1 denotes a phase comparator, 10 a comparison period detection circuit, 11 a phase difference detection circuit, 12 a reset generation circuit, 13 a first logical sum circuit, and 14 a second logical sum circuit.

Since the clock frequency is 1/5 of the data rate f, there are five phases of clocks, and the phase comparator 1 includes five (zeroth to fourth) each of the comparison period detection circuits 10, the phase difference detection circuits 11, and the reset generation circuits 12.

The $m^{th}$ comparison period detection circuit 10 receives the $(m-1)^{th}$-phase clock signal as the first clock, the $m^{th}$-clock signal as the second clock, and the $m^{th}$ clear signal output from the $m^{th}$ phase difference detection circuit to output the $m^{th}$ comparison enable signal.

The $m^{th}$ reset generation circuit 12 receives the $(m-1)^{th}$-phase clock signal as the first clock and the $m^{th}$-clock signal as the second clock to output the $m^{th}$ reset signal if the first clock is H and the second clock is L, and output H otherwise.

The $m^{th}$ phase difference detection circuit 11 receives the $m^{th}$ comparison enable signal, the data, the $(m+2)^{th}$-phase clock signal as the reference clock, and the $(m+3)^{th}$ reset signal as the reset signal to output the $m^{th}$ clear signal, the $m^{th}$ UP signal and the $m^{th}$ DOWN signal.

The first logical sum circuit 13 obtains the logical sum of the UP signals output from the phase difference detection circuits, and the second logical sum circuit 14 obtains the logical sum of the DOWN signals, which are output as the phase comparison result of the phase comparator 1.

Figure 7:
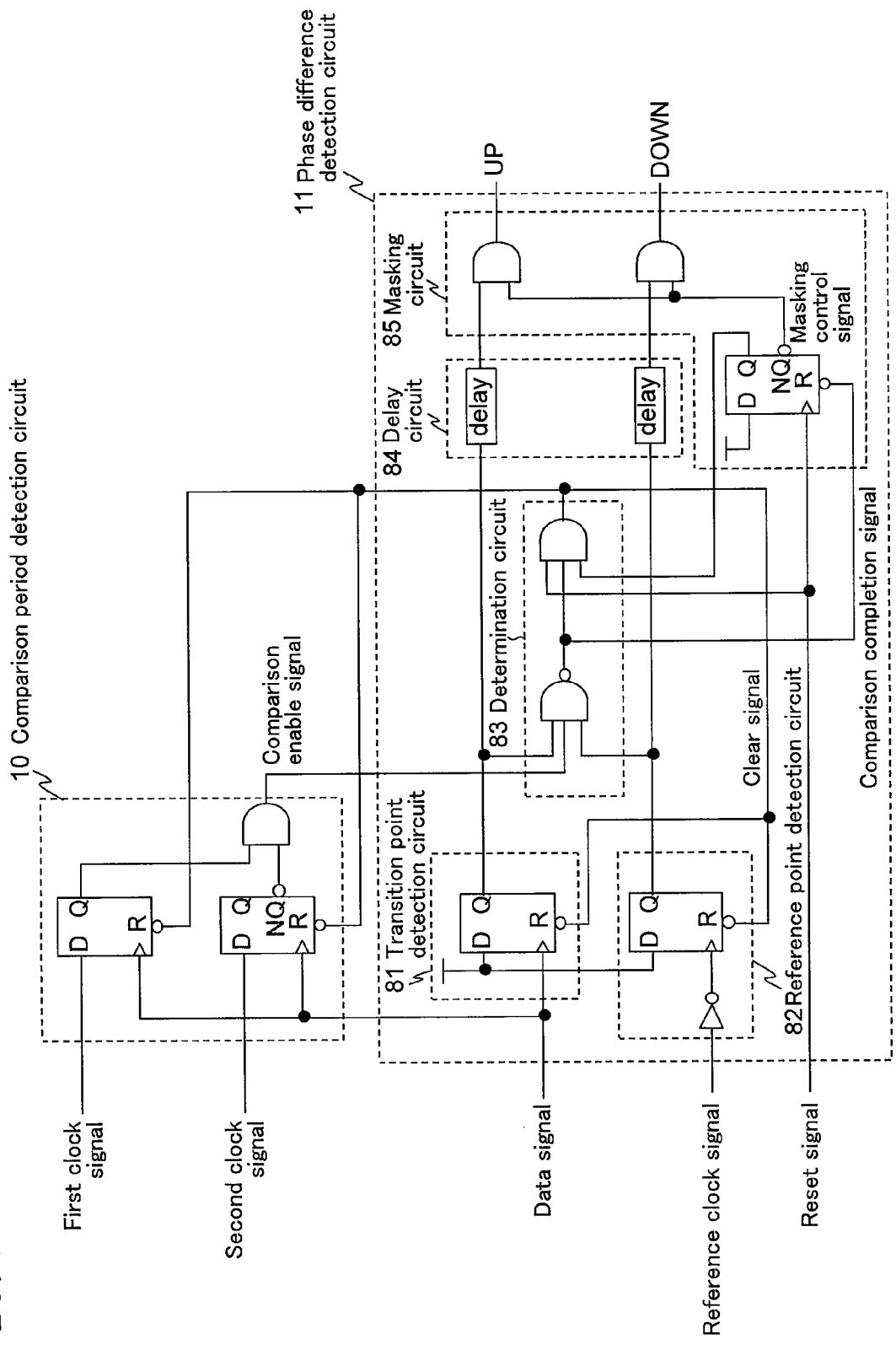
FIG. 7 shows a configuration of a phase difference detection circuit provided in the phase comparator according to the third embodiment of the present invention.

FIG. 7 shows a configuration of the comparison period detection circuit 10 and the phase difference detection circuit 11. In the figure, 81 denotes a transition point detection circuit, 82 a reference point detection circuit, 83 a determination circuit, 84 a delay circuit, and 85 a masking circuit.

The comparison period detection circuit 10 is implemented by a flip flop circuit that latches the first clock and the second clock in synchronism with the rising edge of the data signal. Moreover, these flip flop circuits reset the result being held when the clear signal goes L. Based on the outputs of these flip flop circuits, the comparison period detection circuit 10 outputs H as the comparison enable signal when the result of latching the first clock is H and the result of latching the second clock is L, and outputs L otherwise.

The transition point detection circuit 81 is a flip flop circuit that latches H in synchronism with the rising edge of the data signal, and resets the stored content to L when receiving the clear signal. The reference point detection circuit 82 is a flip flop circuit that latches H in synchronism with the falling edge of the reference clock, and resets the stored content to L when receiving the clear signal.

The determination circuit 83 turns the comparison completion signal to L only while both outputs of the transition point detection circuit 81 and the reference point detection circuit 82 and the comparison enable signal are all H, and turns the clear signal to L if that condition is met, or if the reset signal is L, or the masking control signal is H.

The delay circuit 84 delays both of the outputs of the transition point detection circuit 81 and the reference point detection circuit 82 by the same amount.

The masking circuit 85 includes a flip flop circuit that outputs, as the masking control signal, H during a period in which the comparison completion signal is L, and L in synchronism with the rising edge of the reset signal during other periods, thereby allowing the output signal of the delay circuit 84 to pass therethrough only during a period in which the masking control signal is H, outputting L during other periods.

Figure 8:
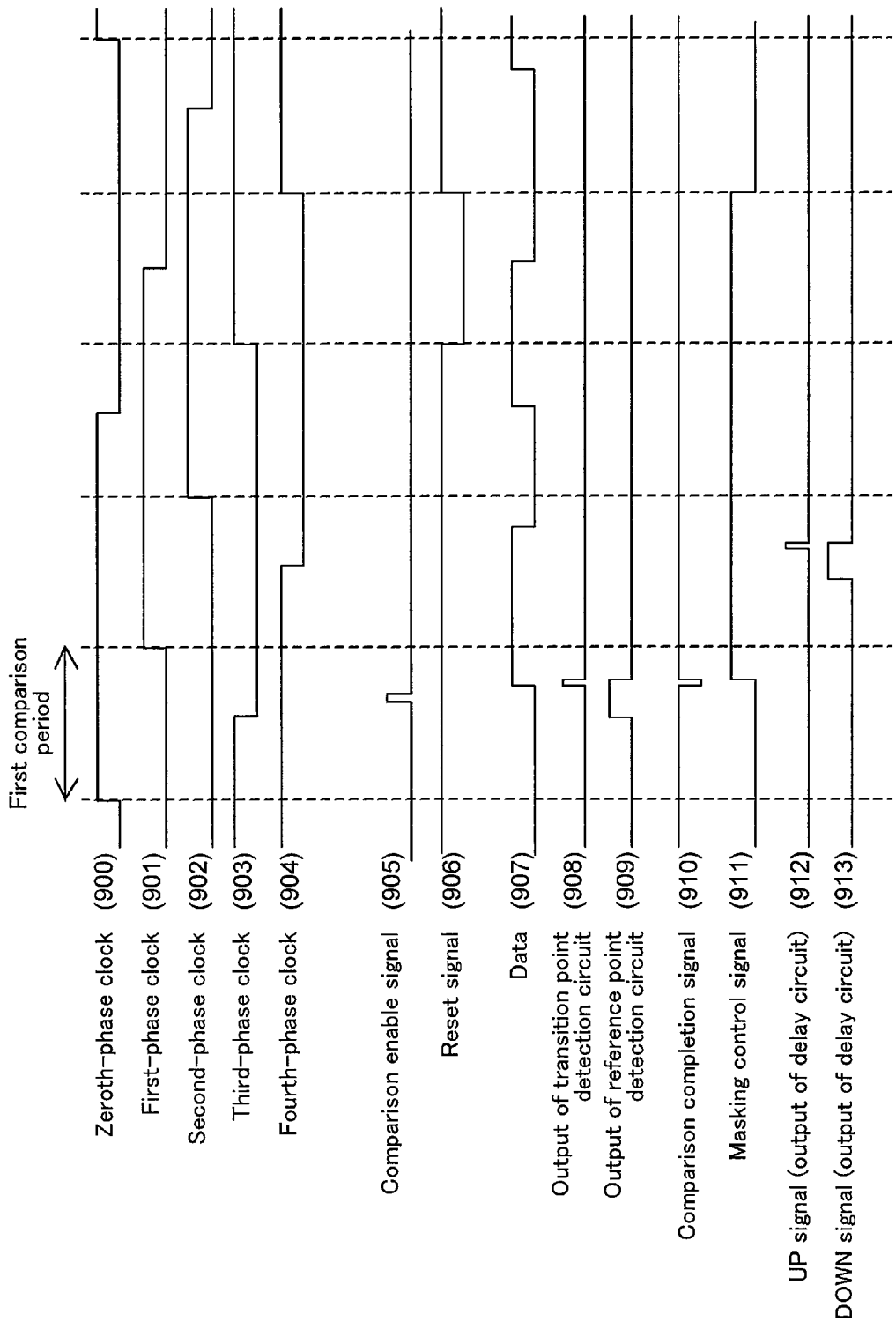
FIG. 8 shows an operation diagram of the phase difference detection circuit.

FIG. 8 shows a timing diagram of the operation of the first comparison period detection circuit 10 and the first phase difference detection circuit 11. The phase comparison operation will now be described with reference to FIGS. 7 and 8.

With the configuration of the phase comparator shown in FIG. 6, the first clock signal and the second clock signal in FIG. 7 correspond to the zeroth-phase clock and the first-phase clock in FIG. 8. The reference clock signal in FIG. 7 is the third-phase clock in FIG. 8, and the reset signal in FIG. 8 is the fourth comparison enable signal output from the fourth comparison period detection circuit.

The comparison period detection circuit 10 holds a zeroth-phase clock 900 and a first-phase clock 901 at the rising edge of data 907, and outputs H as the first comparison enable signal 905 if the result of holding the zeroth-phase clock 900 is H and the result of holding the first-phase clock 901 is L, and outputs L otherwise. Therefore, the first comparison enable signal 905 goes H in synchronism with the rising edge of data 907 occurring within the first comparison period.

In the phase difference detection circuit 11, the transition point detection circuit 81 and the reference point detection circuit 82 latch H at a transition point of the data 907 and a transition point of the reference clock 903, respectively. In FIG. 8, since the falling edge of the reference clock 903 precedes the data 907, the reference point detection circuit 82 first turns an output signal 909 to H in synchronism with the falling edge of the reference clock 903, and then the transition point detection circuit 81 turns an output signal 908 to H in synchronism with the rising edge of the data 907. The output signal 908 of the transition point detection circuit 81 and the output signal 909 of the reference point detection circuit 82 are both input to the determination circuit 83 and to the delay circuit 84.

The determination circuit 83 constantly monitors the output signal 908 of the transition point detection circuit 81, the output signal 909 of the reference point detection circuit 82, and the first comparison enable signal 905, and transitions a comparison completion signal 910 to L at a point in time when all of these signals go H. As a result, the first clear signal also goes L, thus resetting the outputs 908 and 909 of the transition point detection circuit 81 and the reference point detection circuit 82 to L and turning the comparison completion signal back to H. At the same time, the flip flop circuits inside the first comparison period detection circuit 10 are also reset by the first clear signal, and the first comparison enable signal 905 also goes back L.

The delay circuit 84 delays each of the outputs 908 and 909 of the transition point detection circuit 81 and the reference point detection circuit 82 by 1 T. Note however that the delay value of the delay circuit 84 is not limited to 1 T, and may be set within the range of 0.5 T or more and up to 0.5 T before a masking control signal 911 is reset to L. Since the description herein assumes the use of the phase comparator having a configuration as shown in FIG. 6, it may be set within the range of 0.5 T or more and 3 T or less.

In the masking circuit 85, when the comparison completion signal 910 goes L, the masking control signal 911 goes H to stop masking the output of the delay circuit 84. Thus, until the masking control signal 911 goes back L at the rising edge of a reset signal 906, the output signals of the delay circuit 84 are output, as they are, as the first UP signal 912 and the first DOWN signal 913 being the result of the process of the first phase difference detection circuit 11.

The masking control signal 911 generated in the masking circuit 85 is also input to the determination circuit 83, and the first clear signal is fixed to L during a period in which the masking control signal 911 is H. As a result, the first comparison period detection circuit 10, the transition point detection circuit 81 and the reference point detection circuit 82 are reset, and even if a rising edge of the data 907 occurs during a period other than the first comparison period and in which the masking control signal 911 is H, the transition point detection circuit 81 and the reference point detection circuit 82 continue to output L, thereby preventing the first UP signal 912 and the first DOWN signal 913 from being output erroneously.

The description above has been directed to a case where there is a rising edge of the data 907 within the first comparison period. In contrast, the operation of the first comparison period detection circuit 10 and the first phase difference detection circuit 11 will now be described for a case where there is no rising edge of the data 907 within the first comparison period and a rising edge of the data 907 occurs in other periods.

If a rising edge of the data 907 occurs in a period other than the first comparison period, the first comparison enable signal 905 remains at L. Therefore, the comparison completion signal 910 output from the determination circuit 83 remains at H, and the masking control signal 911 also remains at L. On the other hand, the transition point detection circuit 81 outputs H in synchronism with the rising edge of the data 907, but it is masked by the masking circuit 85 since the masking control signal 911 remains at L, whereby the first UP signal 912 and the first DOWN signal 913 both remain at L.

Fourth Embodiment

Figure 9:
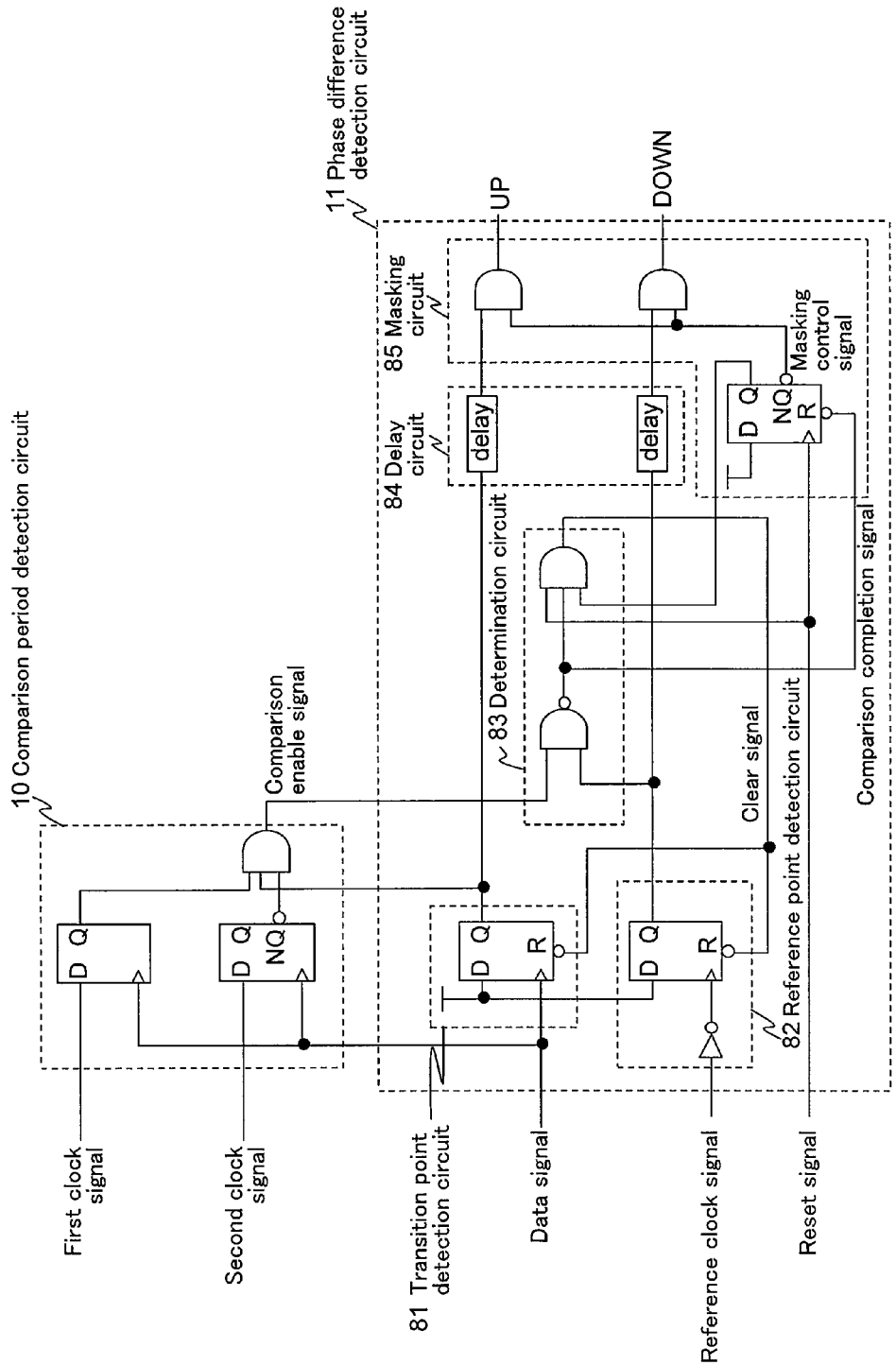
FIG. 9 shows a configuration of a phase difference detection circuit provided in the phase comparator according to the fourth embodiment of the present invention.

FIG. 9 shows the comparison period detection circuit 10 and the phase difference detection circuit 11 of a fourth embodiment for use in the phase comparator 1 shown in FIG. 6. The present embodiment corresponds to claim 8.

The comparison period detection circuit 10 and the phase difference detection circuit 11 have substantially the same configurations as those of the third embodiment. A difference is that the comparison period detection circuit 10 does not turn the comparison enable signal H as long as the output of the transition point detection circuit 81 is not H, even if there is a data transition within the comparison period.

In order to eliminate the redundancy in logic, the determination circuit 83 in the phase difference detection circuit 11 does not monitor the output of the transition point detection circuit 81, and turns the comparison completion signal to L only when the comparison enable signal and the output of the reference point detection circuit 82 are both H.

Figure 10:
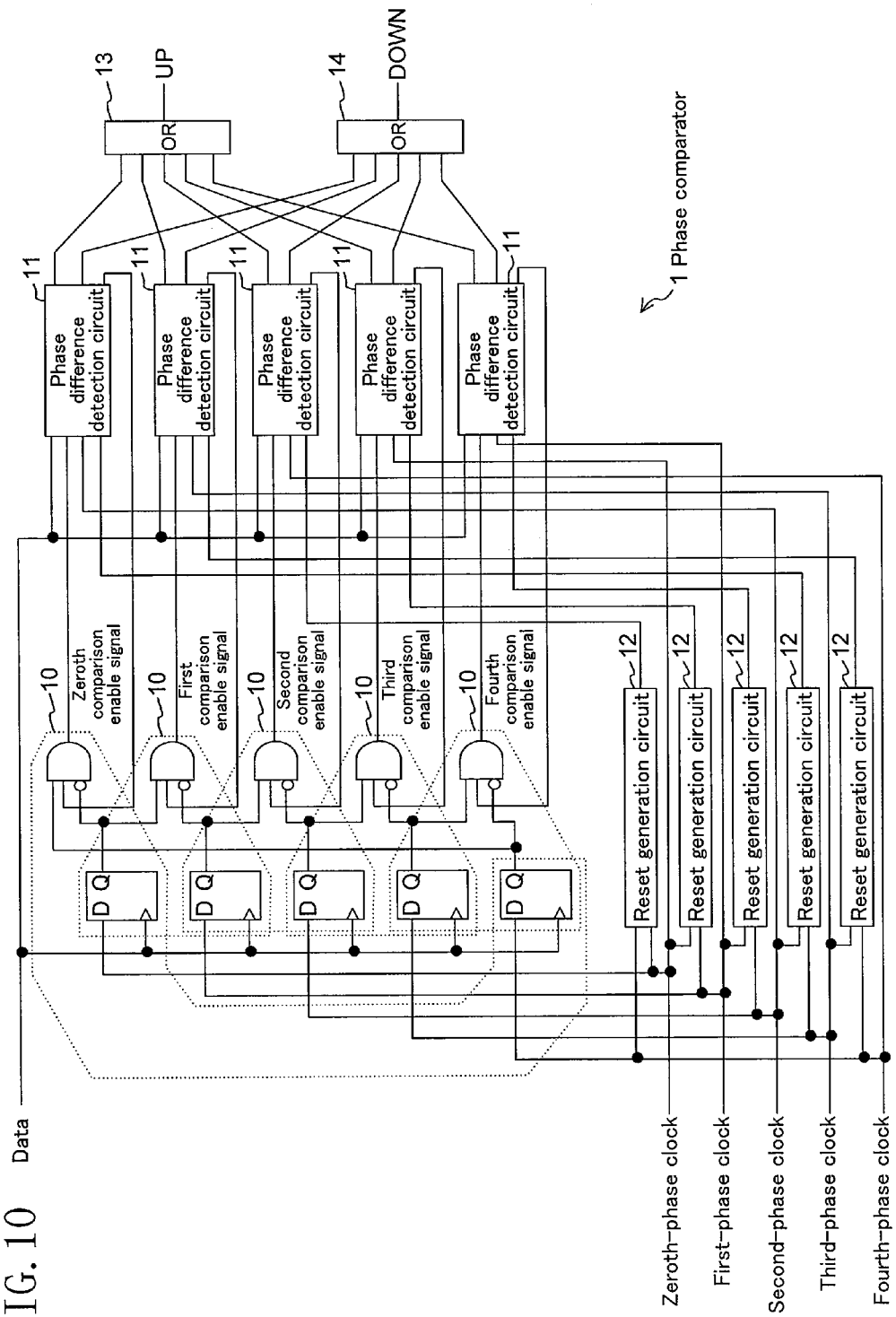
FIG. 10 shows a general configuration of the phase comparator according to the fourth embodiment of the present invention.

With this configuration, the phase comparison operation is represented by the same timing diagram as that in the third embodiment shown in FIG. 8. With this configuration, there is no need for a reset signal for the flip flop circuits holding the first clock and the second clock inside the comparison period detection circuit 10. Therefore, the phase comparator 1 no longer needs the clear signal, which is otherwise passed from the phase difference detection circuit 11 to the comparison period detection circuit 10, and instead the output result of the transition point detection circuit 81 is passed to the comparison period detection circuit 10.

Where the comparison period detection circuit 10 and the phase difference detection circuit 11 take a configuration as disclosed in the fourth embodiment, each flip flop circuit in the $m^{th}$ comparison period detection circuit 10 can be a shared flip flop circuit that is used also as one of the flip flop circuits in the $(m-1)^{th}$ comparison period detection circuit 10 and the $(m+1)^{th}$ comparison period detection circuit 10 for latching the clock of the same phase. FIG. 10 shows such a configuration of the phase comparator 1.

Fifth Embodiment

Figure 11:
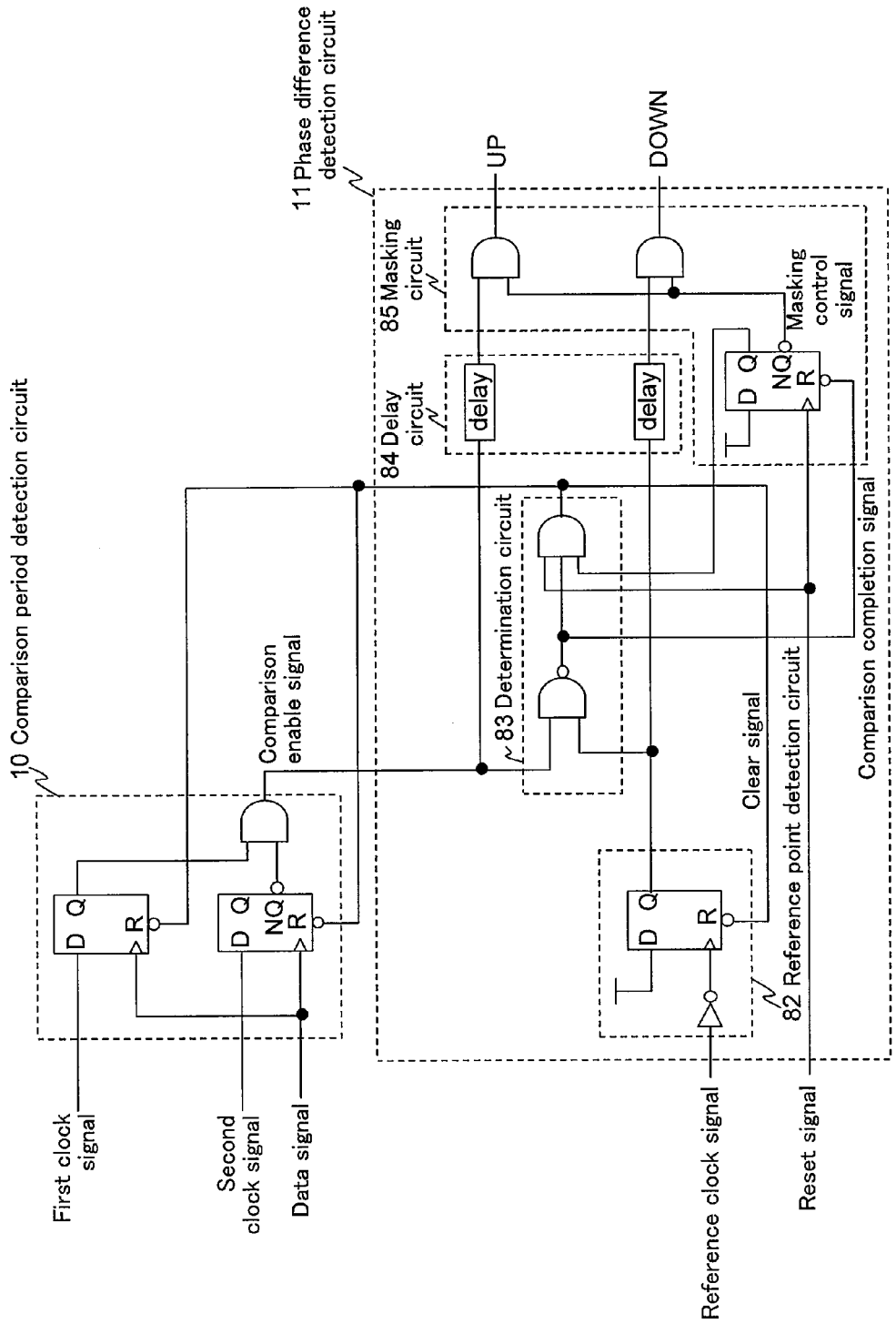
FIG. 11 shows a configuration of a phase difference detection circuit provided in a phase comparator according to a fifth embodiment of the present invention.

FIG. 11 shows the comparison period detection circuit 10 and the phase difference detection circuit 11 of a fifth embodiment for use in the phase comparator 1 shown in FIG. 6. The present embodiment corresponds to claim 9.

A difference from the third embodiment is that the phase difference detection circuit 11 uses the comparison enable signal instead of the output of the transition point detection circuit 81. Therefore, with this configuration, it is not necessary to provide the transition point detection circuit 81. With this configuration, the comparison completion signal of the determination circuit 83 goes L when the comparison enable signal and the output of the reference point detection circuit 82 are both H. The delay circuit 84 delays the comparison enable signal and the output of the reference point detection circuit 82 by a predetermined amount of time. With this configuration, the phase comparison operation is represented by the same timing diagram as that in the third embodiment shown in FIG. 8.

Sixth Embodiment

Figure 12:
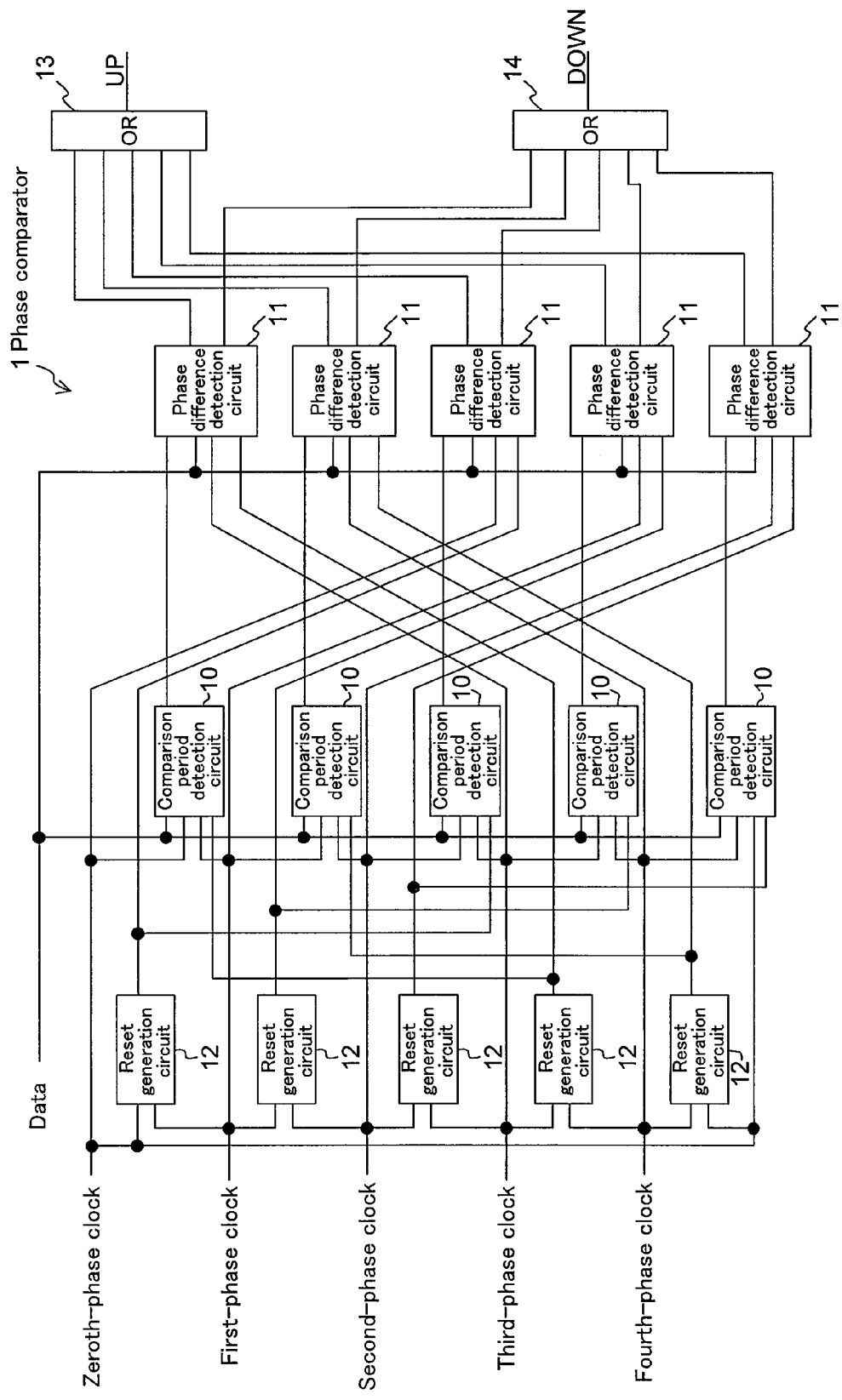
FIG. 12 shows a general configuration of a phase comparator according to sixth to eighth embodiments of the present invention.

FIG. 12 shows a phase comparator according to a sixth embodiment of the present invention. The present embodiment corresponds to claim 10.

In the figure, 1 denotes a phase comparator, 10 a comparison period detection circuit, 11 a phase difference detection circuit, 12 a reset generation circuit, 13 a first logical sum circuit, and 14 a second logical sum circuit.

Since the clock frequency is ⅕ of the data rate f, there are five phases of clocks, and the phase comparator 1 includes five (zeroth to fourth) each of the comparison period detection circuits 10, the phase difference detection circuits 11, and the reset generation circuits 12.

The $m^{th}$ comparison period detection circuit 10 receives the $(m-1)^{th}$-phase clock signal as the first clock, the $m^{th}$-clock signal as the second clock, and the $(m+3)^{th}$ reset signal output from the $m^{th}$ phase difference detection circuit to output the $m^{th}$ comparison enable signal.

The $m^{th}$ reset generation circuit 12 receives the $(m-1)^{th}$-phase clock signal as the first clock, the $m^{th}$-clock signal as the second clock to output L as the $M^{th}$ reset signal if the first clock is H and the second clock is L, and output H otherwise.

The $m^{th}$ phase difference detection circuit 11 receives the $m^{th}$ comparison enable signal, the data, the $(m+2)^{th}$-phase clock signal as the reference clock, and the $(m+3)^{th}$ reset signal as the reset signal to output the m h clear signal, the $m^{th}$ UP signal and the $m^{th}$ DOWN signal.

The first logical sum circuit 13 obtains the logical sum of the UP signals output from the phase difference detection circuits, and the second logical sum circuit 14 obtains the logical sum of the DOWN signals, which are output as the phase comparison result of the phase comparator 1.

Figure 13:
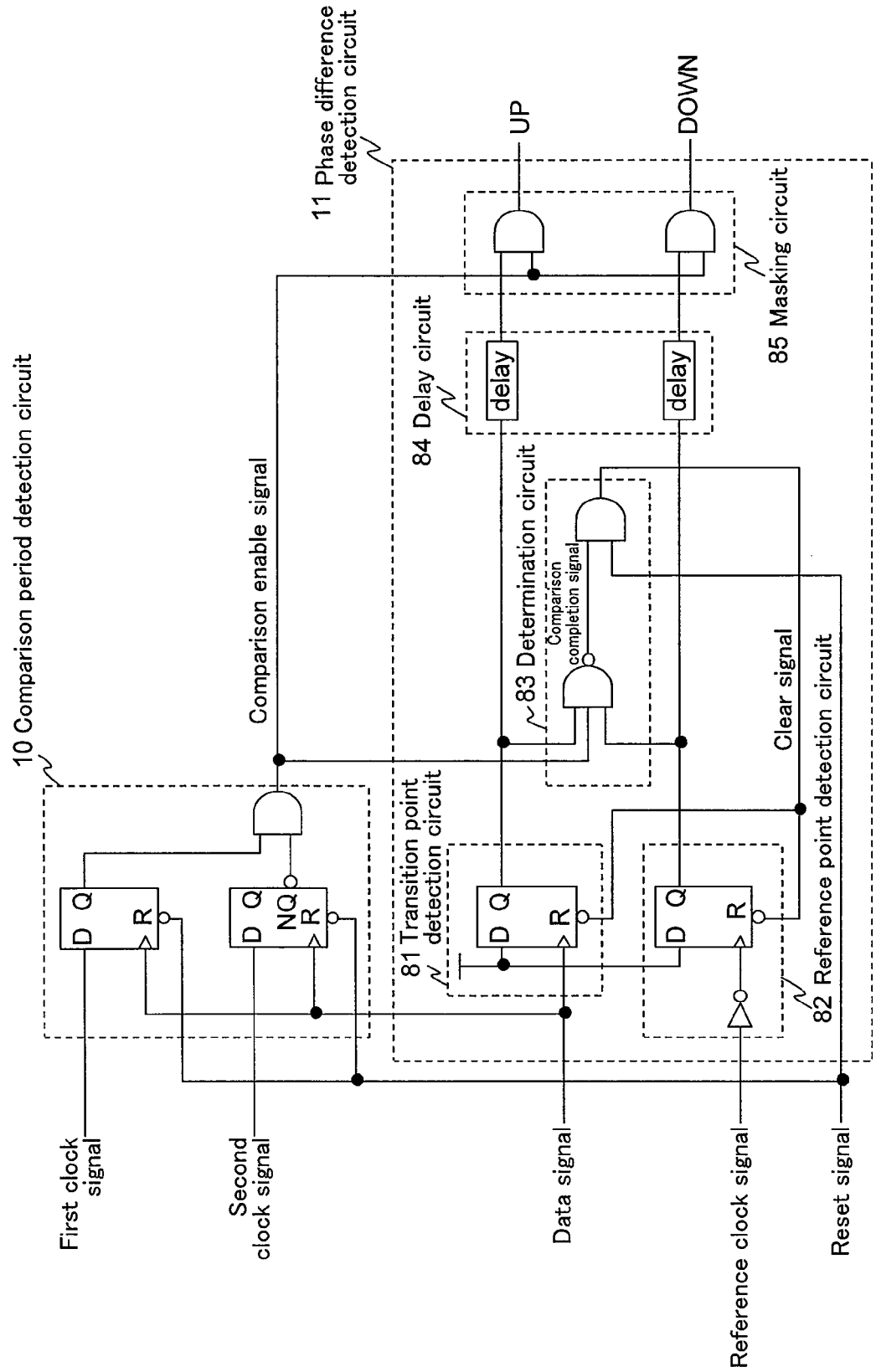
FIG. 13 shows a configuration of a phase difference detection circuit provided in the phase comparator according to the sixth embodiment of the present invention.

FIG. 13 shows the comparison period detection circuit 10 and the phase difference detection circuit 11 of a sixth embodiment for use in the phase comparator 1 shown in FIG. 12. The first comparison period detection circuit and the first phase difference detection circuit of this configuration will now be described.

This configuration differs from that of FIG. 7 in that the fourth reset signal is used as a signal for resetting the flip flop circuits of the comparison period detection circuit 10, and the masking circuit 85 uses the first comparison enable signal to mask the output signal of the delay circuit 84. Moreover, in the determination circuit 83, when the comparison completion signal goes L or the fourth reset signal goes L, the clear signal goes L to reset the transition point detection circuit 81 and the reference point detection circuit 82.

Figure 14:
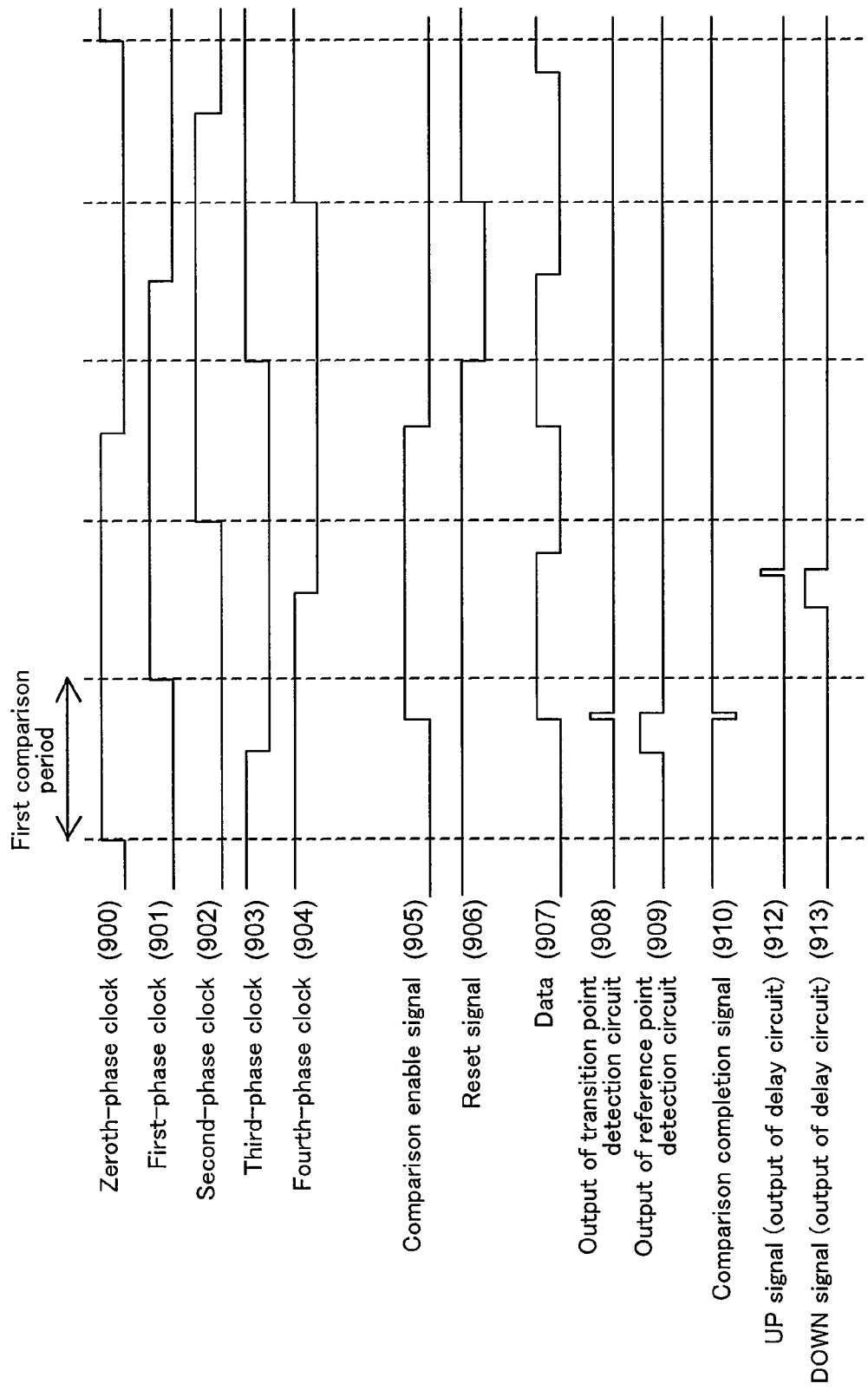
FIG. 14 shows an operation diagram of the phase difference detection circuit.

FIG. 14 shows a timing diagram of the operation of this configuration. A difference from FIG. 8 is when the comparison enable signal goes L. At each rising edge of the data signal, the comparison period detection circuit 10 determines whether it is within a comparison period to output the comparison enable signal based on the result of determination. Therefore, referring to the figure, at the second rising edge of the data 907, the comparison enable signal goes back L and the masking circuit 85 starts the masking operation. The interval between rising edges of the data is 2 T at shortest, in which case the range of the delay value of the delay circuit 84 is 0.5 T or more and 1.5 T or less. Note however that with this configuration, the start of the masking operation is determined by the rising edge of the data, thereby being influenced by the jitter of the data signal. Therefore, the delay value is preferably set to be less than or equal to a period of time obtained by subtracting the jitter from 1.5 T.

If one employs a configuration where during a period in which the comparison enable signal is H, the comparison period detection circuit 10 does not make a determination as to whether it is within a comparison period even if there is a rising edge of the data, but instead holds the previous determination result, the point in time when the comparison enable signal is reset is when the fourth reset signal goes L, whereby the range of the delay value of the delay circuit 84 is 0.5 T or more and 2 T or less.

Seventh Embodiment

Figure 15:
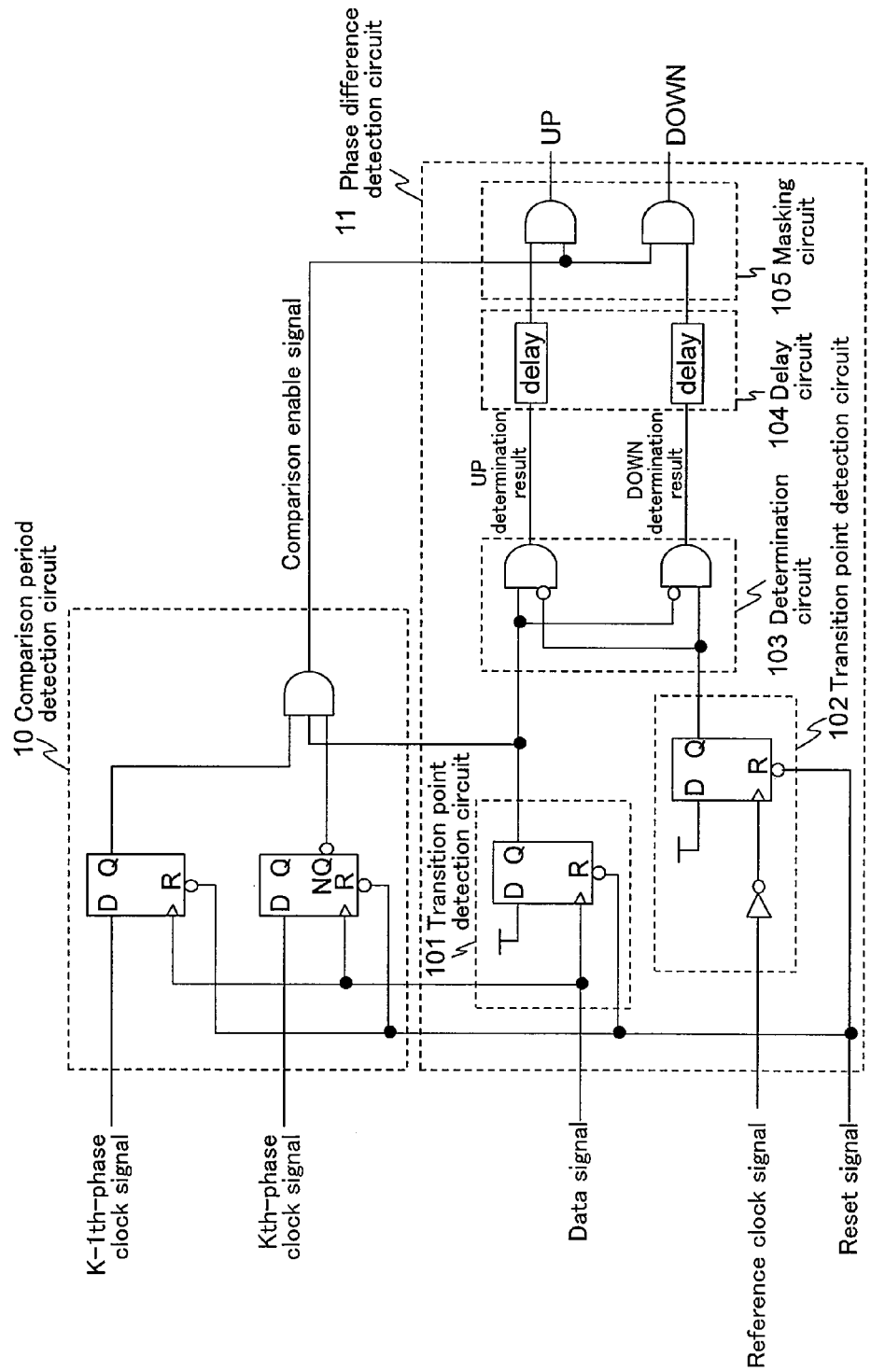
FIG. 15 shows a configuration of a phase difference detection circuit provided in the phase comparator according to the seventh embodiment of the present invention.

FIG. 15 shows the phase difference detection circuit 11 of a seventh embodiment for use in the phase comparator 1 shown in FIG. 12. The present embodiment corresponds to claim 11.

In the figure, 101 denotes a transition point detection circuit, 102 a reference point detection circuit, 103 a determination circuit, 104 a delay circuit, and 105 a masking circuit.

The comparison period detection circuit 10 is implemented by a flip flop circuit that latches the first clock and the second clock in synchronism with the rising edge of the data signal. Moreover, these flip flop circuits reset the stored result when the reset signal goes L. Based on the outputs of these flip flop circuits, H is output as the comparison enable signal if the result of latching the first clock is H, the result of latching the second clock is L and the output of the transition point detection circuit 101 is H, and L is output otherwise.

The transition point detection circuit 101 is a flip flop circuit that holds H in synchronism with the rising edge of the data signal, and turns the stored content to L when receiving the reset signal. The transition point detection circuit 102 is a flip flop circuit that holds H in synchronism with the falling edge of the reference clock, and turns the stored content to L when receiving the reset signal. The determination circuit 103 masks the output of the reference point detection circuit 102 when the output of the transition point detection circuit 101 is H, and masks the output of the transition point detection circuit 101 when the output of the reference point detection circuit 102 is H.

The delay circuit 104 delays the outputs of the determination circuit 103 by the same amount. The masking circuit 105 allows the output of the delay circuit 104 to pass therethrough during a period in which the comparison enable signal is H, and masks the output to L during other periods.

Figure 16:
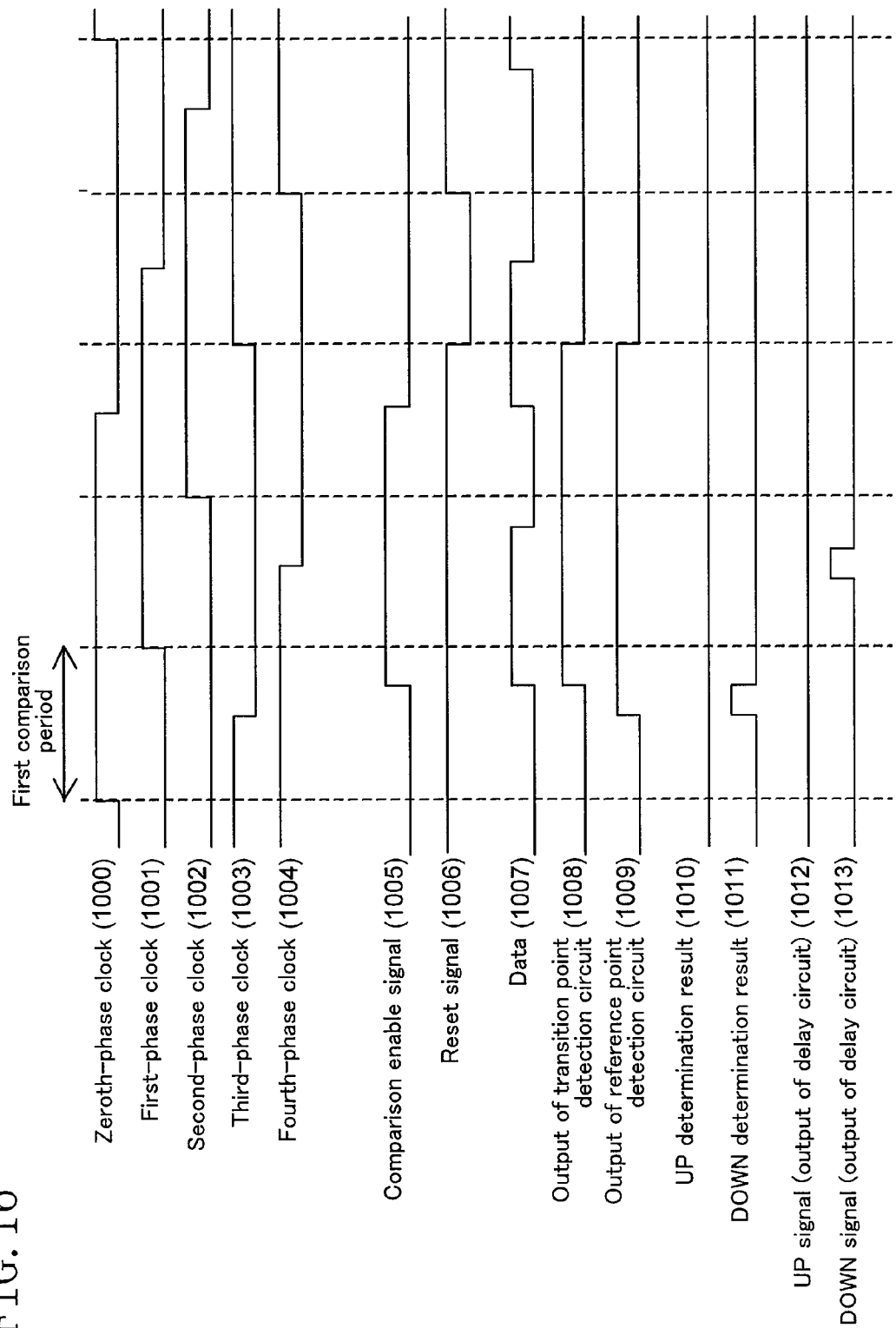
FIG. 16 shows an operation diagram of the phase difference detection circuit.

FIG. 16 shows a timing diagram of the operation of the first comparison period detection circuit and the first phase difference detection circuit shown in FIG. 15. The phase comparison operation will now be described with reference to FIGS. 15 and 16.

As in the description above, the first clock signal and the second clock signal in FIG. 15 correspond respectively to the zeroth-phase clock and the first-phase clock in FIG. 16. The reference clock signal in FIG. 15 is the third-phase clock in FIG. 16, and the reset signal in FIG. 16 is the fourth comparison enable signal output from the fourth comparison period detection circuit.

The comparison period detection circuit 10 holds a zeroth-phase clock 1000 and a first-phase clock 1001 at the rising edge of the data 1007 to output H as the first comparison enable signal 1005 if the result of holding the zeroth-phase clock 1000 is H, the result of holding the first-phase clock 1001 is L and an output signal 1008 of the transition point detection circuit 101 is H, and outputs L otherwise. Therefore, the first comparison enable signal 1005 goes H at the rising edge of data 1007 occurring within the first comparison period.

The transition point detection circuit 101 turns the output 708 to H at the rising edge of the data 1007. The reference point detection circuit 62 outputs H at the falling edge of the reference clock 703. In FIG. 16, since the falling edge of the reference clock 1003 precedes the data 1007, the reference point detection circuit 102 first outputs H in synchronism with the falling edge of the reference clock 1003, and then the transition point detection circuit 101 outputs H in synchronism with the rising edge of the data 1007.

The determination circuit 103 constantly monitors the output signal 1008 of the transition point detection circuit 101 and an output signal 1009 of the reference point detection circuit 102, wherein when one of the signals goes H, the other is masked to L. Thus, the preceding output 1009 of the reference point detection circuit 102 is output as a DOWN determination result 1011. Then, an UP determination result 1010, being the other output of the determination circuit 103, is masked to L by the DOWN determination result 1011. Then, when the transition point detection circuit 101 starts outputting H, the DOWN determination result 1011 is also masked to L, thereby forming a pulse whose width is equal to the phase difference between the data 1007 and the reference clock 1003.

The delay circuit 104 delays each of the UP determination result 1010 and the DOWN determination result 1011 by 1 T.

The masking circuit 105 allows the outputs 1012 and 1013 of the delay circuit 104 to pass therethrough during a period in which the output signal 1008 of the transition point detection circuit 101 is H, and masks the outputs to L during other periods. The outputs of the masking circuit 105 are, as they are, used as the first UP signal and the first DOWN signal, which are output as the processing result of the first phase difference detection circuit.

The comparison period detection circuit 10 transitions the comparison enable signal 1005 to L at the next rising edge of the data 1007. At this point, the masking circuit 105 starts the masking operation.

As can be seen from such an operation, the delay value of the delay circuit 104 is not limited to 1 T, and may be set within the range of 0.5 T or more and up to 0.5 T before the shortest interval between rising edges of the data. Since the shortest interval between rising edges of the data is 2 T, the delay value that can be set by the delay circuit 104 is 0.5 T or more and 1.5 T or less. In practice, however, it is preferably the value obtained by subtracting the jitter from 1.5 T because the rising edge of the data is influenced by the jitter. If one employs a configuration where the comparison period detection circuit 10 stops the process of detecting the comparison period while the comparison enable signal 1005 is H, as described above in the sixth embodiment, the point in time when the comparison enable signal 1005 is reset is when the reset signal goes L, whereby the delay value that can be taken by the delay circuit 104 can be set within the range of 0.5 T or more and 2 T or less.

The description above has been directed to an operation where there is a data transition point within the comparison period. In a case where there is no data transition point within the comparison period, the comparison enable signal remains at L, whereby even when the transition point detection circuit 61 and the reference point detection circuit 62 go H, the output of the masking circuit 105 remains unchanged at L, and the output of the first phase difference detection circuit remains at L.

Eighth Embodiment

Figure 17:
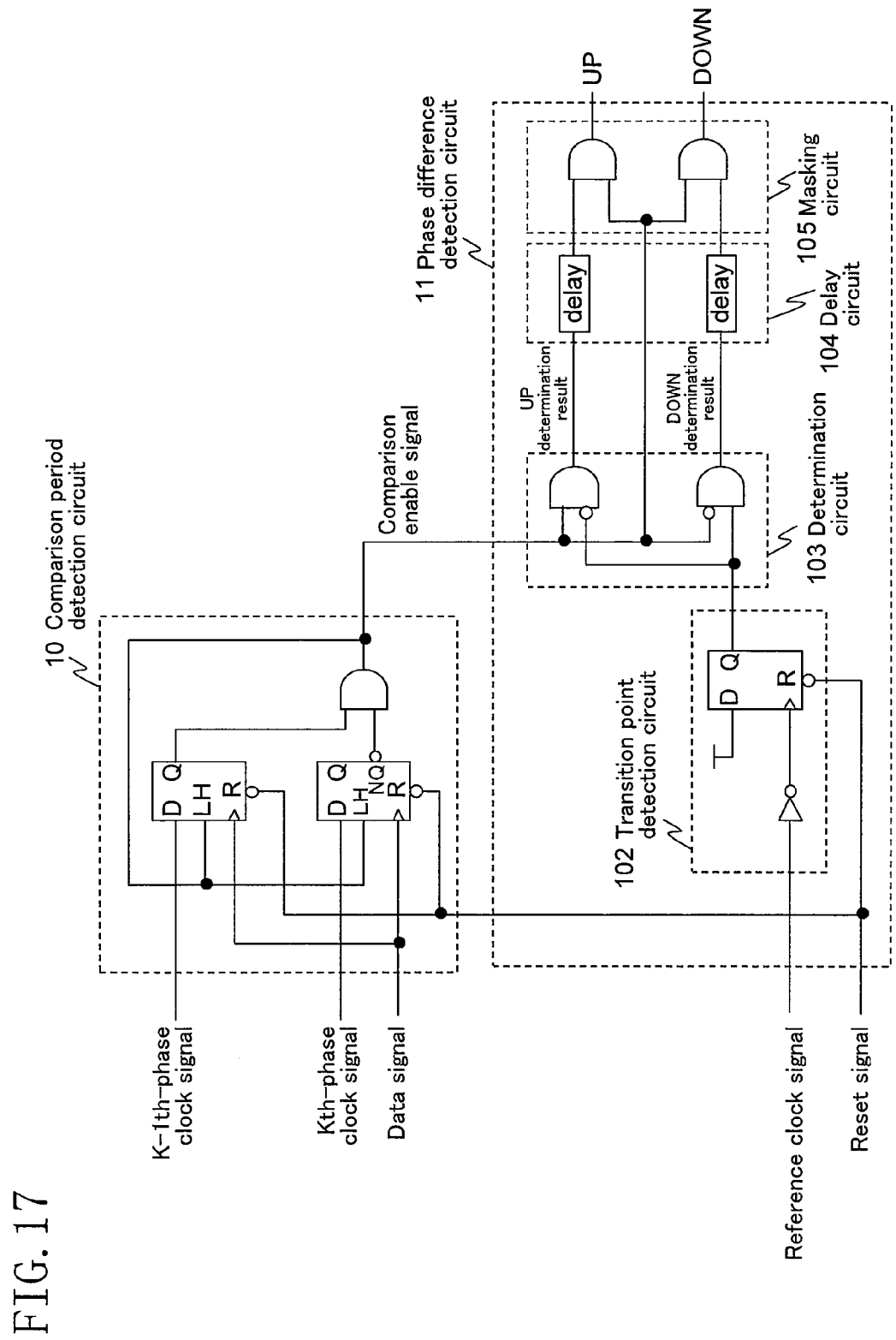
FIG. 17 shows a configuration of a phase difference detection circuit provided in the phase comparator according to the eighth embodiment of the present invention.

FIG. 17 shows the comparison period detection circuit 10 and the phase difference detection circuit 11 of an eighth embodiment for use in the phase comparator 1 shown in FIG. 12. The present embodiment corresponds to claims 1, 3 and 4. The present embodiment corresponds to claim 13.

A difference from the seventh embodiment is that the phase difference detection circuit 11 uses the comparison enable signal instead of the output of the transition point detection circuit 101. Therefore, with this configuration, it is not necessary to provide the transition point detection circuit 101. Specifically, the determination circuit 103 receives the comparison enable signal and the output of the reference point detection circuit 102 to output the DOWN determination result as a result of masking the output of the reference point detection circuit 102 based on the comparison enable signal and output the UP determination result as a result of masking the comparison enable signal based on the output of the reference point detection circuit 102.

The configuration of FIG. 17 includes the comparison period detection circuit 10 that stops the process of detecting the comparison period during a period in which the comparison enable signal is H, as described above in the sixth embodiment and the seventh embodiment. While a comparison period detection circuit having a configuration as shown in FIGS. 13 and 15 may of course be used, the delay value of the delay circuit 104 is defined by the shortest interval between rising edges of the data.

With the configuration shown in FIG. 17, the phase comparison operation is represented by basically the same timing diagram as that in the seventh embodiment shown in FIG. 16, except for the point in time when the comparison enable signal 1005 goes back L being different due to the difference in structure of the comparison period detection circuit 10. With the present configuration, the comparison enable signal 1005 goes L when a reset signal 1006 goes L.

Ninth Embodiment

Figure 18:
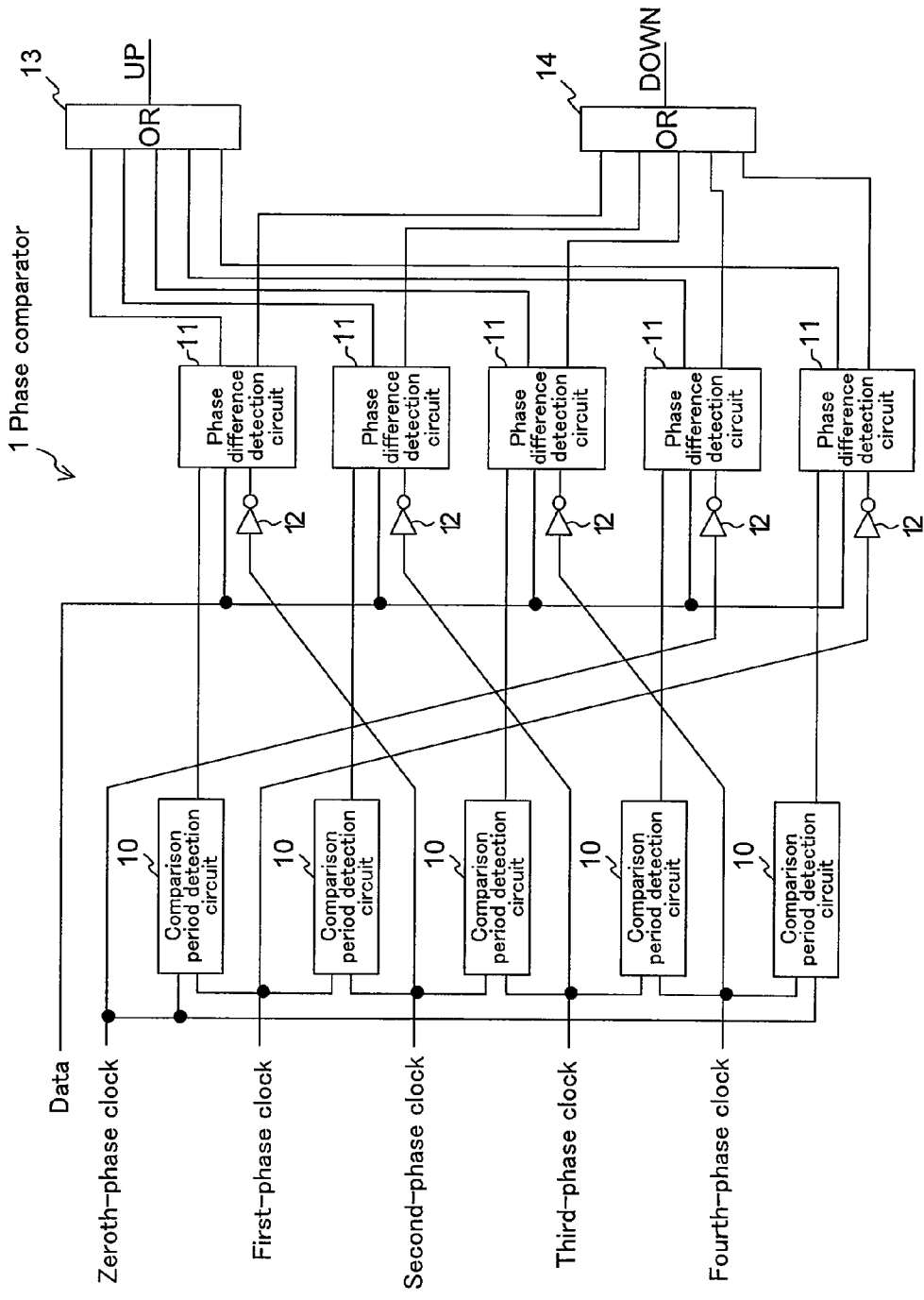
FIG. 18 shows a general configuration of a phase comparator according to a ninth embodiment of the present invention.

FIG. 18 shows a phase comparator according to a ninth embodiment of the present invention. The present embodiment corresponds to claims 15 and 16.

In the figure, 1 denotes a phase comparator, 10 a comparison period detection circuit, 11 a phase difference detection circuit, 12 a reset generation circuit, 13 a first logical sum circuit, and 14 a second logical sum circuit.

Since the clock frequency is ⅕ of the data rate f, there are five phases of clocks, and the phase comparator 1 includes five (zeroth to fourth) each of the comparison period detection circuits 10, the phase difference detection circuits 11, and the reset generation circuits 12.

The $m^{th}$ comparison period detection circuit 10 receives the $(m-1)^{th}$-phase clock signal as the first clock, the $m^{th}$-clock signal as the second clock, and the $m^{th}$ clear signal output from the $m^{th}$ phase difference detection circuit to output the $m^{th}$ comparison enable signal.

The $m^{th}$ reset generation circuit 12 reverses the $(m+1)^{th}$-phase clock signal to output the reverse signal as the $m^{th}$ reset signal. It is understood that a signal that is L during the $(m-2)^{th}$ comparison period or the $(m-1)^{th}$ comparison period may be used as the $m^{th}$ reset signal.

The $m^{th}$ phase difference detection circuit 11 receives the $m^{th}$ comparison enable signal, the data, the $(m+2)^{th}$-phase clock signal as the reference clock, and the $m^{th}$ reset signal as the reset signal to output the $m^{th}$ UP signal and the $m^{th}$ DOWN signal.

The first logical sum circuit 13 obtains the logical sum of the UP signals output from the phase difference detection circuits, and the second logical sum circuit 14 obtains the logical sum of the DOWN signals, which are output as the phase comparison result of the phase comparator 1.

Figure 19:
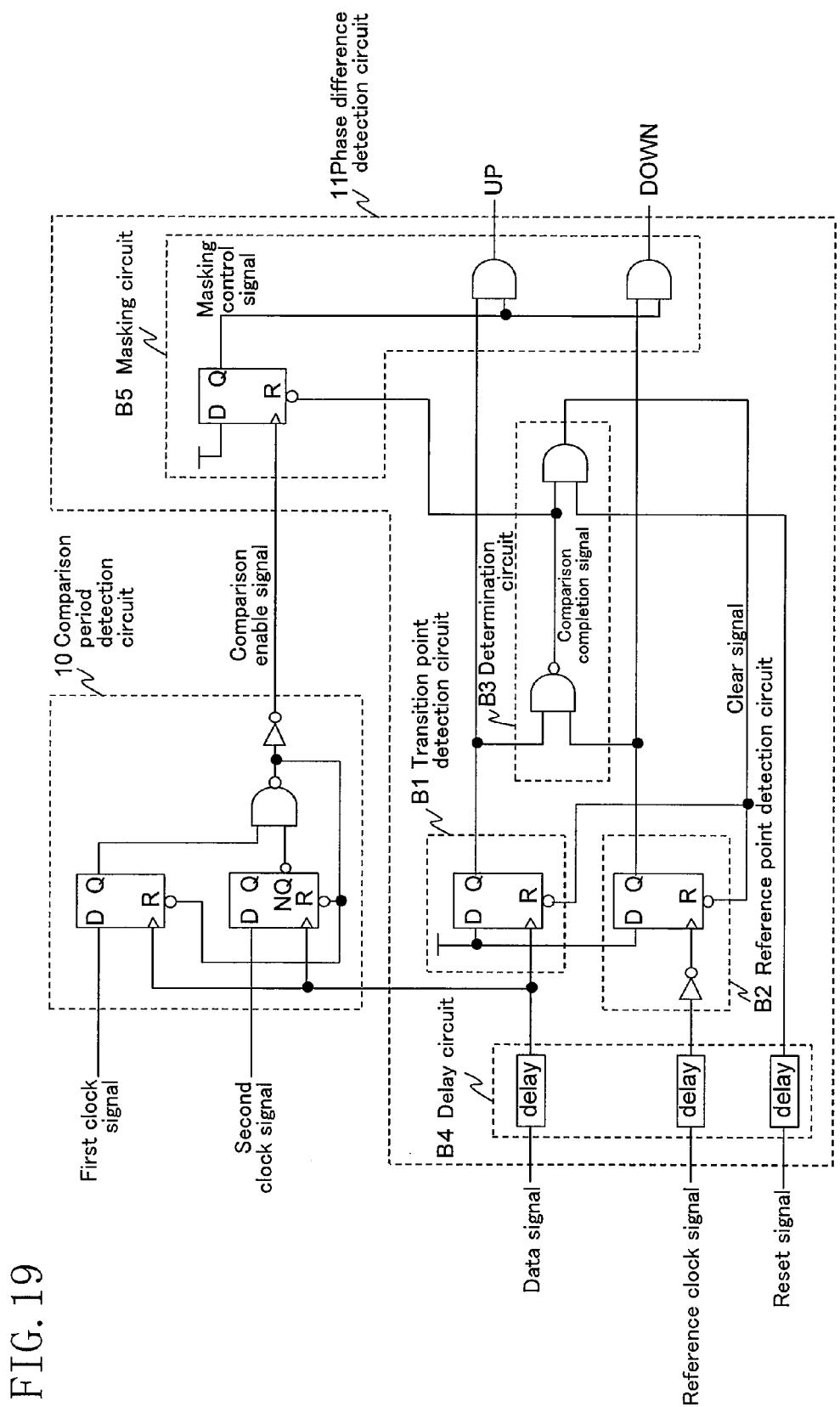
FIG. 19 shows a configuration of a phase difference detection circuit provided in the phase comparator.

FIG. 19 shows a configuration of the comparison period detection circuit 10 and the phase difference detection circuit 11. In the figure, B1 denotes a transition point detection circuit, B2 a reference point detection circuit, B3 a determination circuit, B4 a delay circuit, and B5 a masking circuit.

The comparison period detection circuit 10 is implemented by a flip flop circuit that latches the first clock and the second clock in synchronism with the rising edge of the data signal. Based on the outputs of these flip flop circuits, H is output as the comparison enable signal if the result of latching the first clock is H and the result of latching the second clock is L, and L is output otherwise. Moreover, these flip flop circuits reset the stored results when the comparison enable signal goes H. As a result, the comparison enable signal also goes back L, thus resulting in a pulse-like signal.

The masking circuit B5 includes a flip flop circuit that outputs, as the masking control signal, L during a period in which the comparison completion signal is L, and H in synchronism with the rising edge of the comparison enable signal during other periods, thereby allowing the output signals of the transition point detection circuit B1 and the reference point detection circuit B2 to pass therethrough only during a period in which the masking control signal is H, outputting L during other periods.

The transition point detection circuit B1 is a flip flop circuit that latches H in synchronism with the rising edge of the data signal delayed by the delay circuit B4, and resets the stored content to L when receiving the clear signal. The reference point detection circuit B2 is a flip flop circuit that latches H in synchronism with the falling edge of the reference clock delayed by the delay circuit B4, and resets the stored content to L when receiving the clear signal.

The determination circuit B3 keeps the comparison completion signal at L during a period in which the outputs of the transition point detection circuit B1 and the reference point detection circuit B2 are all H, and keeps the clear signal at L during that period and during a period in which the reset signal being received via the delay circuit B4 is L.

The delay circuit B4 delays the data signal, the reference clock signal and the reset signal by the same amount.

Figure 20:
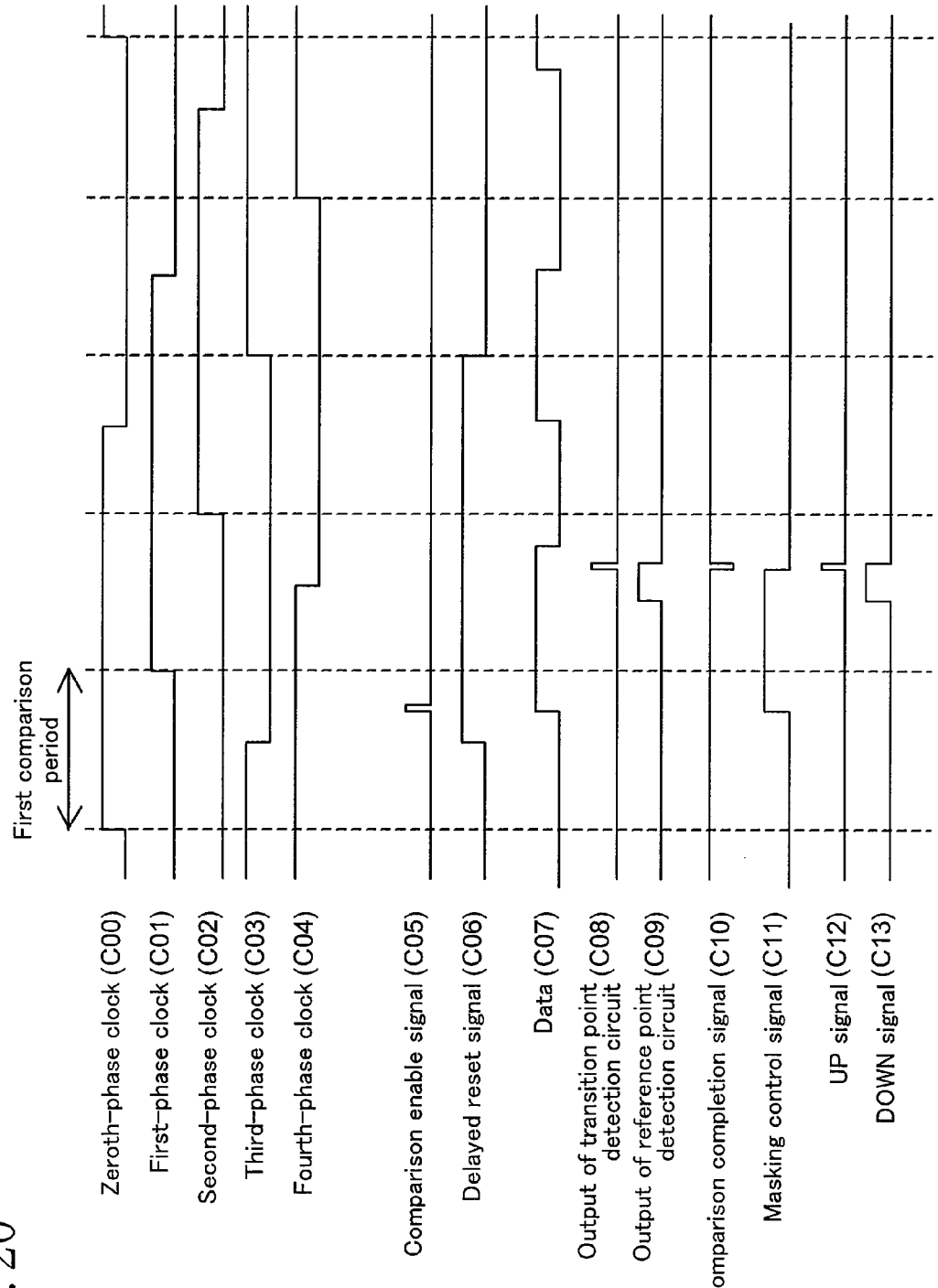
FIG. 20 shows an operation diagram of the phase difference detection circuit.

FIG. 20 shows a timing diagram of the operation of the first comparison period detection circuit 10 and the first phase difference detection circuit 11. The phase comparison operation will now be described with reference to FIGS. 19 and 20.

With the configuration of the phase comparator shown in FIG. 18, the first clock signal and the second clock signal in FIG. 19 correspond respectively to the zeroth-phase clock and the first-phase clock in FIG. 20. The third-phase clock in FIG. 20 is used as the reference clock signal in FIG. 19, and the reverse signal of the second-phase clock is used as the reset signal in FIG. 20.

The comparison period detection circuit 10 holds a zeroth-phase clock C00 and a first-phase clock C01 at the rising edge of data C07, and outputs H as the first comparison enable signal C05 if the result of holding the zeroth-phase clock C00 is H and the result of holding the first-phase clock C01 is L, and outputs L otherwise. Therefore, at the first rising edge of the data in FIG. 20, the first comparison enable signal C05 goes H in synchronism with the rising edge of the data C07 occurring within the first comparison period. However, as a result of this, the flip flop circuits in the first comparison period detection circuit 10 are reset, whereby the first comparison enable signal C05 goes back L immediately.

The delay circuit B4 delays each of the data signal C07, the reference clock C03 and the reset signal by 1 T. Note however that the delay value of the delay circuit B4 is not limited to 1 T, and may be set within the range of 0.5 T or more and less than 4 T.

In the phase difference detection circuit 11, the transition point detection circuit B1 and the reference point detection circuit B2 latch H at the transition points of the data C07 and the reference clock C03, respectively, which are delayed by the delay circuit B4. In FIG. 20, since the falling edge of the reference clock C03 precedes the data C07, the reference point detection circuit B2 first turns an output signal C09 to H in synchronism with the falling edge of the delayed reference clock, and then the transition point detection circuit B1 turns an output signal C08 to H in synchronism with the rising edge of the delayed data. The output signal C08 of the transition point detection circuit B1 and the output signal C09 of the reference point detection circuit B2 are both input to the determination circuit B3.

The determination circuit B3 constantly monitors the output signal C08 of the transition point detection circuit B1 and the output signal C09 of the reference point detection circuit B2, and transitions a comparison completion signal C10 to L when these signals go H. As a result, the first clear signal also goes L, thus resetting the outputs C08 and C09 of the transition point detection circuit B1 and the reference point detection circuit B2 to L and turning the comparison completion signal back to H.

In the masking circuit B5, a masking control signal C11 goes H at the rising edge of the comparison enable signal C05 to stop masking both outputs of the transition point detection circuit B1 and the reference point detection circuit B2. On the other hand, when the comparison completion signal C10 goes L, the masking control signal C11 goes L to start masking both outputs of the transition point detection circuit B1 and the reference point detection circuit B2. While the masking is stopped, the output signals of the delay circuit 84 are output, as they are, as the first UP signal C12 and the first DOWN signal C13 being the result of the process of the first phase difference detection circuit 11. After the masking is started, the first UP signal C12 and the first DOWN signal C13 are fixed to L.

The description above has been directed to a case where there is a rising edge of the data C07 within the first comparison period. In contrast, the operation of the first comparison period detection circuit 10 and the first phase difference detection circuit 11 will now be described for a case where there is no rising edge of the data C07 within the first comparison period and a rising edge of the data C07 occurs in other periods.

If a rising edge of the data C07 occurs in a period other than the first comparison period, the first comparison enable signal C05 remains at L. As a result, the masking control signal C11 never goes H. On the other hand, although the transition point detection circuit B1 outputs H in synchronism with the rising edge of the data C07, it is masked by the masking circuit B5, resulting in the first UP signal C12 and the first DOWN signal C13 both remaining at L.

Other than the first comparison period, there is no falling edge of the reference clock, and the comparison completion signal C10 does not go L. However, as a delayed reset signal C06 is input, the clear signal goes L, thus resetting the transition point detection circuit which has become H.

(Another Example of Reset Signal Production)

In the description above, a signal that goes L between the rising edge of the $(m+2)^{th}$-phase clock and the rising edge of the $(m+3)^{th}$-phase clock is used as a reset signal of the $m^{th}$ phase difference detection circuit. However, it is understood that the reset signal generation timing and the pulse width of the reset signal can be changed. In such a case, it is necessary to ensure that, where d denotes the delay value of the delay circuit, a reset occurs at or after the point in time when the delay value d elapses since the rising edge of the $m^{th}$-phase clock and that a reset is canceled before the rising edge of the next cycle of the $(m-1)^{th}$-phase clock.

Note however that in the third, fourth, sixth to seventh embodiments, the value of the transition point detection circuit of the $m^{th}$ phase difference detection circuit needs to have been reset at the start of the $m^{th}$ comparison period. Where the data contains no jitter and the data bit width is accurately T, the reset may be canceled at the rising edge of the $(m-1)^{th}$-phase clock as in the above description. While the above description has assumed such an ideal state, if data contains jitter, however, a rising edge of the data may possibly occur T-j (j is the jitter) before the start of the $m^{th}$ comparison period, whereby the reset needs to be maintained until a predetermined point in time that is between immediately before the start of the next $m^{th}$ comparison period and T-j before the start.

While the description above has been directed to a case where the start of the masking by masking circuit of the $m^{th}$ phase difference detection circuit is at the rising edge of the reset signal, it is understood that it can be set at any point in time between when the delay value d of the delay circuit and the amount of time p needed for a signal to pass through the masking circuit elapse since the completion of the $m^{th}$ comparison period and the start of the $m^{th}$ comparison period of the next cycle.

While the description above has been directed to a configuration where the transition point detection circuit operates in synchronism with the rising edge of the data, it may operate in synchronism with the falling edge of the data. Moreover, it may operate in synchronism with both the rising edge and the falling edge of the data, in which case the frequency of the phase comparison operation is doubled, thus improving the sensitivity. Note however that in the third, fourth, sixth to seventh embodiments, the value of the transition point detection circuit of the $m^{th}$ phase difference detection circuit needs to have been reset at the start of the $m^{th}$ comparison period, as described above, the reset needs to be maintained from a predetermined point in time after the elapse of the delay value d since the rising edge of the $m^{th}$-phase clock until another predetermined point in time that is between immediately before the start of the next $m^{th}$ comparison period and 0.5 T-j before the start.

(Example of Configuration of Phase Regulation Circuit)

Next, a phase regulation circuit using a phase comparator as described above will be described. The present embodiment corresponds to claims 17 and 18. It is assumed herein that the phase comparator performs a phase comparison operation by using N phases (N is an integer greater than or equal to 1) of clocks.

Figure 21:
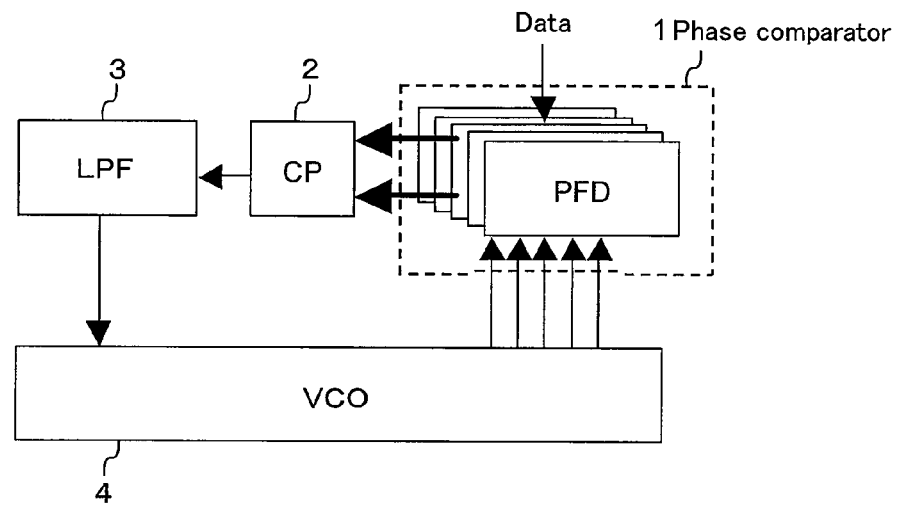
FIG. 21 shows an exemplary configuration of a phase regulation circuit.

FIG. 21 shows an example of a configuration of a phase regulation circuit using the phase comparator 1 as described above. In the figure, 1 denotes a phase comparator, 2 a charge pump, 3 a low pass filter, and 4 a VCO.

The phase comparator 1 is a phase comparator as described above in the first to eighth embodiments, and compares the phase of the data with the phase of each of the N phases of clocks output from the VCO 4, outputting the UP signal and the DOWN signal as the result of phase comparison to the charge pump 2. The charge pump 2 turns ON/OFF the current based on the received UP or DOWN signal to thereby vary the control voltage of the VCO 4. The low pass filter 3 removes the high-frequency component of the control voltage of the VCO 4. The VCO 4 varies the clock frequency based on the control voltage thus controlled so as to regulate the phase relationship between the data and the clock, and the clock frequency.

As the phase comparator 1 regulates the clock of the VCO 4, the rising edge of the clock of the VCO 4 will be positioned substantially at the center of the data bit. Thus, phase regulation can easily be realized by successively latching the data using the zeroth-phase to $N^{th}$-phase clocks output from the VCO 4.

Figure 22:
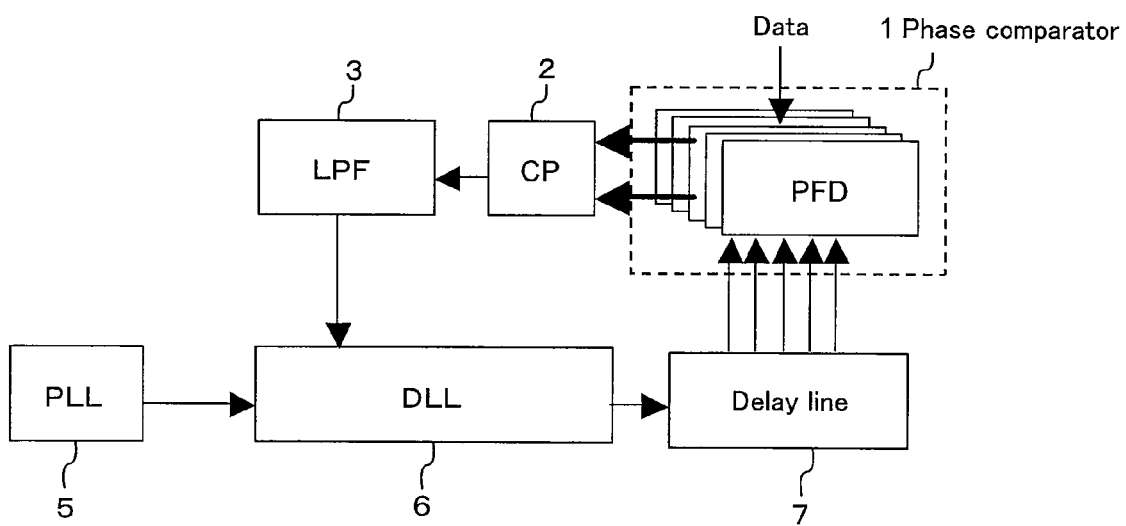
FIG. 22 shows another exemplary configuration of a phase regulation circuit.
Figure 23:
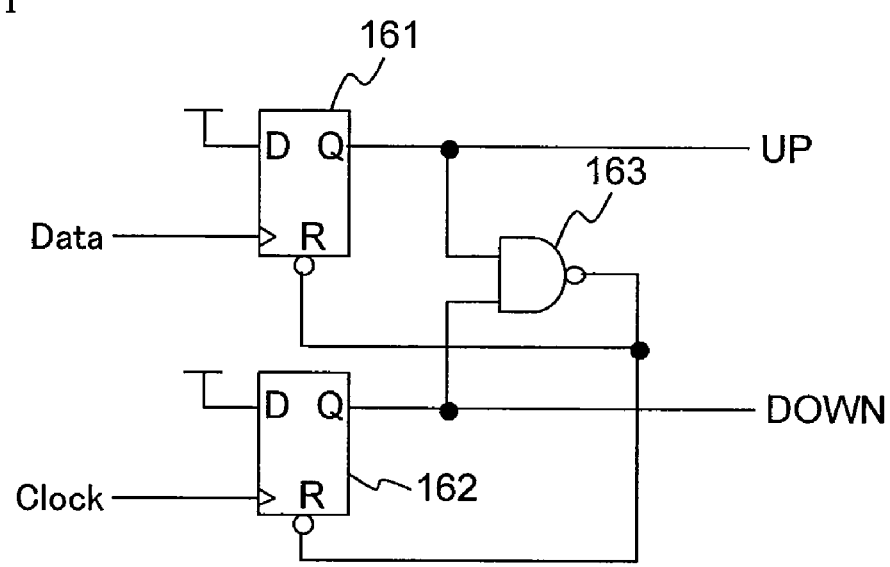
FIG. 23 shows a configuration of a conventional phase difference detection circuit.
Figure 24:
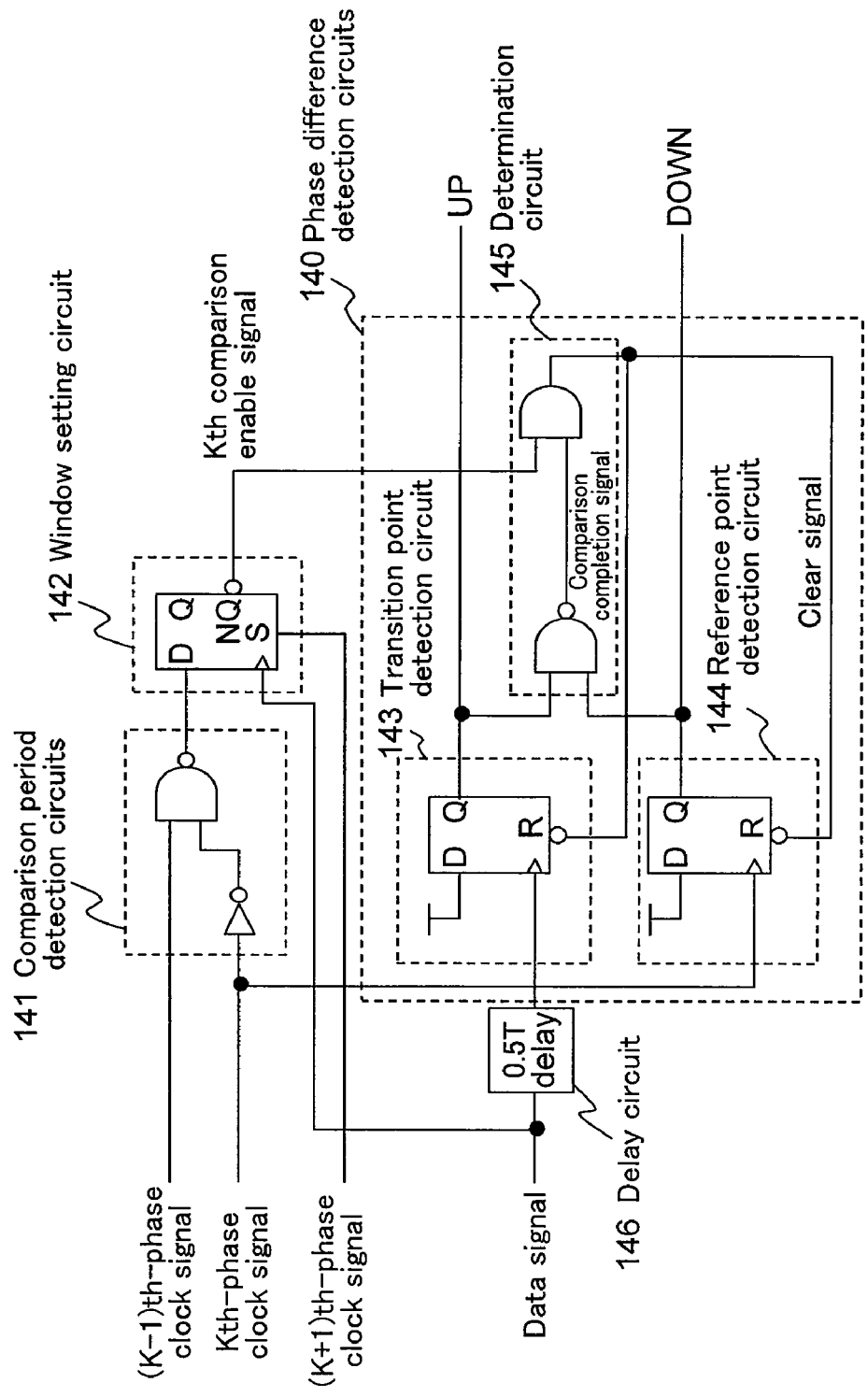
FIG. 24 shows a configuration of another conventional phase difference detection circuit.
Figure 25:
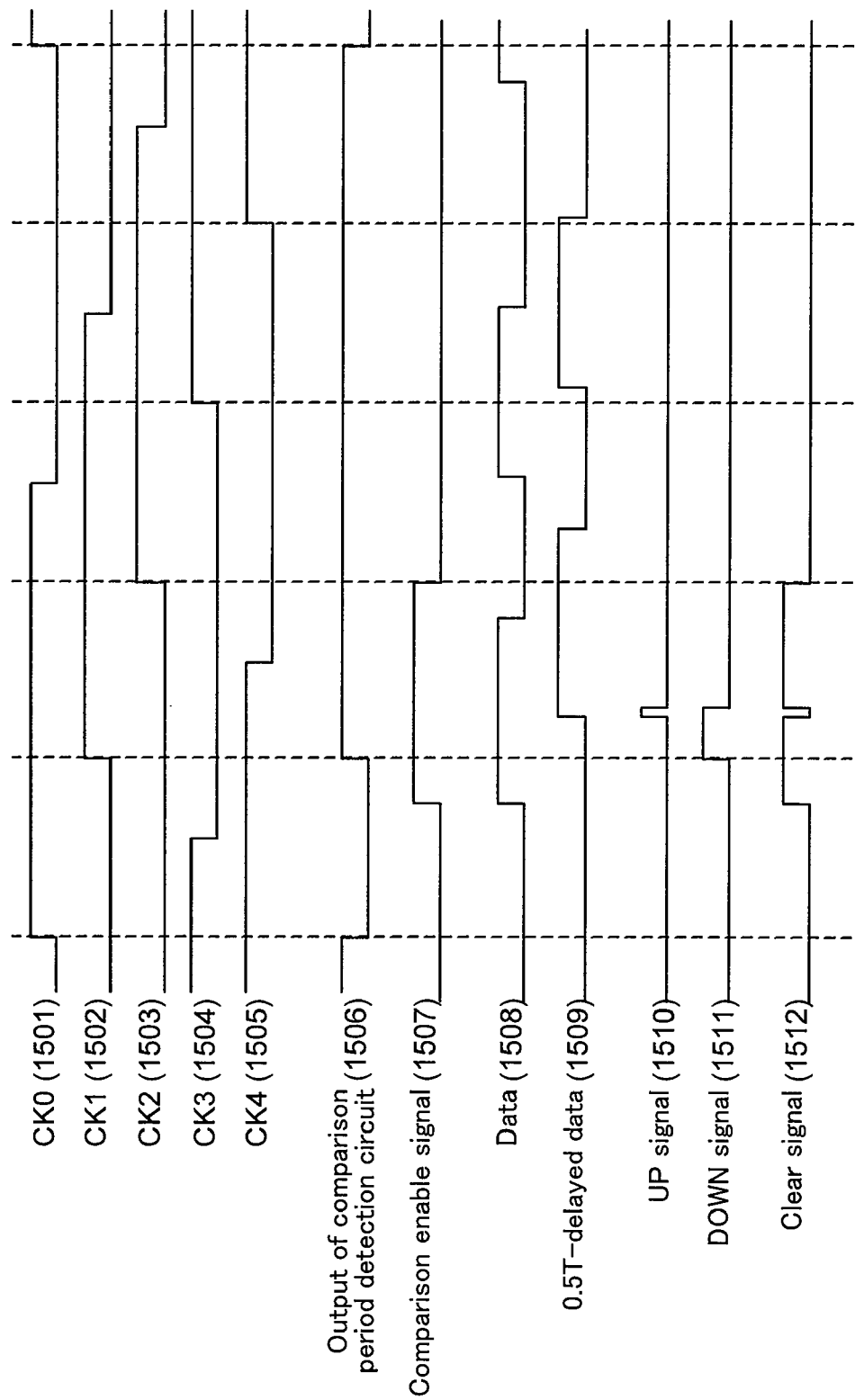
FIG. 25 shows an operation diagram of the conventional phase difference detection circuit.

FIG. 22 shows still another example of a configuration of a phase regulation circuit using the phase comparator 1 as described above. In the figure, 1 denotes a phase comparator, 2 a charge pump, 3 a low pass filter, 5 a PLL, 6 a DLL, and 7 a delay line.

The PLL 5 outputs a clock whose frequency is 1/N of the data rate f. The DLL 6 delays the clock output from the PLL 5 by an amount according to the control voltage output from the low pass filter 3. Moreover, the delay line 7 includes N−1 delay elements whose delay value is T to output N phases of clocks with a phase difference of T therebetween. The phase comparator 1 performs a phase comparison between the N phases of clocks and the data to output the UP signal and the DOWN signal. The charge pump 2 turns ON/OFF the current based on the received UP or DOWN signal to thereby vary the control voltage of the DLL 6. The low pass filter 3 removes the high-frequency component of the control voltage of the DLL 6. The DLL 6 varies the delay value based on the control voltage thus controlled so as to regulate the phase difference between the data and the clock. The rising edge of such a regulated clock will be positioned substantially at the center of the data bit. Thus, phase regulation can easily be realized by successively latching the data using the zeroth-phase to $N^{th}$-phase clocks output from the delay line 7.

While the description above in all embodiments has been directed to a case where there are five (an odd number) phases of clocks, considering the fact that these clocks are differential signals, the system can be viewed as a system using ten (an even number) phases of clocks whose phase difference is 0.5 T and whose frequency is f/5. Thus, it can be seen that a similar operation to that of the description above is performed also where there are even number of phases of clocks. While the reference point detection circuit uses the reverse of the falling edge of the reference clock in the description above, it can easily be inferred that the rising edge of a clock that forms a differential pair with the reference clock can be used instead.

INDUSTRIAL APPLICABILITY

As described above, the present invention provides a simple configuration for detecting a phase difference without requiring high-precision delay cells, wherein the configuration is capable of stably operating against variations in the temperature or the power supply voltage and determining in which a phase comparison has been made normally within the comparison period. Therefore, the configuration can be used in applications such as phase comparators and phase regulation circuits, and is useful as a technique for use in high-speed data communication.

The invention claimed is:

1. A phase comparator for use in clock data recovery means for performing phase regulation and receiving data by using $2N+1$ phases of clock signals whose period is $(2N+1)T$ (N is an integer greater than or equal to 1) and whose phase difference is 1T in data communication where a data rate is 1/T bps, the phase comparator comprising:

$2N+1$ comparison period detection means each for determining whether it is within an $m^{th}$ comparison period, which is defined as a period between a rising edge of a first clock signal and a rising edge of a second clock signal, to output the determination result as an $m^{th}$ comparison enable signal, wherein the first clock signal is the $(m-1)^{th}$-phase (m−1 is a remainder of division by $2N+1$ when it is greater than or equal to 0 and is obtained as m+2N when it is a negative number) clock signal among the $2N+1$ phases of clock signals, and the second clock signal is the $m^{th}$-phase (m is an integer greater than or equal to 0 and less than or equal to 2N) clock signal; and $2N+1$ phase difference detection means each for receiving the $m^{th}$ comparison enable signal, the data and a reference clock to output information on a phase difference between the reference clock and the data when the $m^{th}$ comparison enable signal is active, wherein the reference clock is the $(N+m)^{th}$-phase (N+m is a remainder of division by $2N+1$) clock signal.

2. A phase comparator for use in clock data recovery means for performing phase regulation and receiving data by using 2N phases of clock signals whose period is NT (N is an integer greater than or equal to 1) and whose phase difference is 0.5T in data communication where a data rate is 1/T bps, the phase comparator comprising:

N comparison period detection means each for determining whether it is within an $m^{th}$ comparison period, which is defined as a period between a rising edge of a first clock signal and a rising edge of a second clock signal, to output the determination result as an $m^{th}$ comparison enable signal, wherein the first clock signal is the $(2m-2)^{th}$-phase (2m−2 is a remainder of division by 2N when it is greater than or equal to 0 and is obtained as 2m+2N−2 when it is a negative number) clock signal among the 2N phases of clock signals, and the second clock signal is the $2m^{th}$-phase (m is an integer greater than or equal to 0 and less than or equal to N−1) clock signal; and N phase difference detection means each for receiving the $m^{th}$ comparison enable signal, the data and a reference clock to output information on a phase difference between the reference clock and the data when the $m^{th}$ comparison enable signal is active, wherein the reference clock is the $(2m-1)^{th}$-phase (2m−1 is a remainder of division by 2N when it is greater than or equal to 0 and is obtained as 2m+2N−1) clock signal.

3. The phase comparator of claim 1, wherein:

the comparison period detection means outputs a comparison enable signal by determining whether a transition point of a data signal has occurred within the comparison period; and the phase difference detection means includes:
reference point detection means for detecting an edge of the reference clock to output the detection result as a DOWN signal;
transition point detection means for detecting a transition point of the data signal to output the detection result as an UP signal;
determination means for receiving the UP signal to determine whether there is a data transition point within the comparison period;
delay means for delaying each of the UP signal and the DOWN signal; and
masking means for allowing an output of the delay means to pass therethrough when there is a transition of data and masking the output of the delay means when there is no transition of data, based on an output of the determination means.

4. The phase comparator of claim 3, wherein:

the comparison period detection means activates the comparison enable signal while the first clock signal is H and the second clock signal is L;

when the transition point detection means detects a transition point of the data signal within the comparison period, the transition point detection means holds and outputs the detection result as the UP signal, and the transition point detection means resets a stored content thereof when receiving a clear signal output from the determination means;

the reference point detection means detects a clock edge that is present within the comparison period to hold and output the detection result as the DOWN signal, and resets the stored content thereof when receiving the clear signal output from the determination means;

the determination means outputs a comparison completion signal when both of the UP signal and the DOWN signal are output, and further outputs the clear signal when either a reset signal or the comparison completion signal is output, wherein the reset signal is given at a predetermined point in time between when a delay value defined by the delay means elapses since a rising edge of the $m^{th}$-clock signal and a next rising edge of the first clock signal; and the masking means stops masking an output of the delay means when the comparison completion signal is output, and starts masking the output when the reset signal is output.

5. The phase comparator of claim 3, wherein:

the comparison period detection means activates the comparison enable signal while the first clock signal is H and the second clock signal is L;

when the transition point detection means detects a transition point of the data signal within the comparison period, the transition point detection means holds and outputs the detection result as the UP signal, and the transition point detection means resets a stored content thereof when receiving a reset signal, wherein the reset signal is given at a predetermined point in time between when a delay value defined by the delay means elapses since a rising edge of the second clock signal and a next rising edge of the first clock signal;

the reference point detection means detects a clock edge of the reference clock that is present within the comparison period to hold and output the detection result as the DOWN signal, and resets the stored content thereof when receiving the reset signal;

the determination means outputs a signal being output as it is when either the UP signal or the DOWN signal is output, and stops its output otherwise; and the masking means masks an output of the delay means when the transition point detection means is not outputting the UP signal.

6. The phase comparator of claim 3, wherein:

the comparison period detection means holds the first clock signal and the second clock signal at a transition point of the data signal, is reset at a predetermined point in time between when a period of time necessary for an output of the determination means to settle elapses since a rising edge of the second clock signal and a next rising edge of the first clock signal, and outputs the comparison enable signal when the result of holding the first clock signal is H and the result of holding the second clock signal is L;

when the transition point detection means detects a transition point of the data signal, the transition point detection means holds and outputs the detection result as the UP signal, and the transition point detection means resets a stored content thereof when receiving a clear signal output from the determination means;

when the reference point detection means detects a clock edge of the reference clock, the reference point detection means holds and outputs the detection result as the DOWN signal, and the reference point detection means resets the stored content thereof when receiving the clear signal output from the determination means;

the determination means outputs a comparison completion signal when all of the UP signal, the DOWN signal and the comparison enable signal are output, and further outputs the clear signal when a reset signal is received, when the comparison completion signal is output or when the masking means has stopped a masking stop signal, wherein the reset signal is output at a predetermined point in time after a delay value defined by the delay means elapses since a rising edge of the second clock signal, and the reset signal is stopped at a predetermined point in time within a period of a length T immediately before a next rising edge of the first clock signal; and the masking means outputs the masking stop signal to stop masking the output of the delay means when the comparison completion signal is output, and stops the masking stop signal to start masking the output when the reset signal is output.

7. The phase comparator of claim 6, wherein the masking means outputs the masking stop signal when the comparison completion signal is output, stops the masking stop signal when the reset signal is output, so as to stop the masking process during a period in which the comparison enable signal is output while performing the masking process during other periods.

8. The phase comparator of claim 3, wherein:

the comparison period detection means holds the first clock signal and the second clock signal at a transition point of the data signal, resets a stored content thereof when a reset signal is received, and outputs a comparison enable signal when the result of holding the first clock signal is H and the result of holding the second clock signal is L, wherein the reset signal is output at a predetermined point in time after a delay value defined by the delay means elapses since a rising edge of the second clock signal, and the reset signal is stopped at a predetermined point in time within a period of a length T immediately before a next rising edge of the first clock signal;

when the transition point detection means detects a transition point of the data signal, the transition point detection means holds and outputs the detection result as the UP signal, and the transition point detection means resets the stored content thereof when receiving the reset signal;

the reference point detection means detects a clock edge that is present within the comparison period to hold and output the detection result as the DOWN signal, and resets the stored content thereof when receiving the reset signal;

the determination means outputs a signal being output as it is when either the UP signal or the DOWN signal is output, and stops its output otherwise; and the masking means allows an output of the delay means to pass therethrough when the transition point detection means outputs the UP signal and the comparison enable signal is output, and masks the output otherwise.

9. The phase comparator of claim 1, wherein:

the comparison period detection means activates the comparison enable signal based on a state of the first clock signal and a state of the second clock signal at a transition point of a data signal; and the phase difference detection means includes:
  reference point detection means for detecting an edge of the reference clock to output the detection result as a DOWN signal;
  determination means for receiving the comparison enable signal to determine whether there is a data transition point within the comparison period;
  delay means for delaying each of the comparison enable signal and the DOWN signal; and
  masking means for allowing an output of the delay means to pass therethrough when there is a transition of data and masking the output of the delay means when there is no transition of data, based on an output of the determination means.

10. The phase comparator of claim 9, wherein:

the comparison period detection means holds the first clock signal and the second clock signal at a transition point of the data signal, is reset when a clear signal output from the determination means is received, and outputs a comparison enable signal when the result of holding the first clock signal is H and the result of holding the second clock signal is L;

when the reference point detection means detects a clock edge of the reference clock, the reference point detection means holds and outputs the detection result as the DOWN signal, and the reference point detection means resets a stored content thereof when receiving the clear signal;

the determination means outputs a comparison completion signal when both of the comparison enable signal and the DOWN signal are output, and further outputs the clear signal when a reset signal is received, when the comparison completion signal is output or when the masking means has stopped a masking stop signal, wherein the reset signal is given at a predetermined point in time between when a delay value defined by the delay means elapses since a rising edge of the second clock signal and a next rising edge of the first clock signal; and the masking means outputs the masking stop signal to stop masking the output of the delay means when the comparison completion signal is output, and stops the masking stop signal to start masking the output when the reset signal is output.

11. The phase comparator of claim 9, wherein:
the comparison period detection means holds the first clock signal and the second clock signal at a transition point of the data signal when the comparison enable signal is not output, is reset when a reset signal is received, and outputs a comparison enable signal when the result of holding the first clock signal is H and the result of holding the second clock signal is L, wherein the reset signal is given at a predetermined point in time between when a delay value defined by the delay means elapses since a rising edge of the second clock signal and a next rising edge of the first clock signal;
when the reference point detection means detects a clock edge of the reference clock, the reference point detection means holds and outputs the detection result as the DOWN signal, and the reference point detection means resets a stored content thereof when receiving the reset signal;
the determination means outputs a signal being output as it is when either the comparison enable signal or the DOWN signal is output, and stops its output otherwise; and
the masking means allows an output of the delay means to pass therethrough when the comparison enable signal is output, and masks the output otherwise.

12. The phase comparator of claim 4, wherein:
the masking means is data holding means for holding and outputting a signal input to a data input pin thereof based on a signal input to a clock input pin thereof, and resetting a stored content thereof based on a signal input to a reset input pin thereof; and
the comparison completion signal is input to the reset input pin, the data input pin is fixed to a power supply voltage, and a reset signal is input to the clock input pin, wherein the reset signal is output at a predetermined point in time after a delay value defined by the delay means elapses since a rising edge of the second clock signal, and the reset signal is canceled at a predetermined point in time before a next rising edge of the first clock signal.

13. The phase comparator of claim 6, wherein the comparison period detection means holds the first clock signal and the second clock signal at a transition point of the data signal, and outputs a comparison enable signal when the UP signal is output, the result of holding the first clock signal is H and the result of holding the second clock signal is L.

14. The phase comparator of claim 3, wherein a delay value of the delay means is greater than or equal to 0.5T and less than the period of the clock signal minus 0.5T.

15. The phase comparator of claim 1, wherein:
the comparison period detection means outputs a comparison enable signal by determining whether a transition point of a data signal has occurred within the comparison period; and
the phase difference detection means includes:
delay means for delaying each of the data signal and the reference clock;
reference point detection means for detecting an edge of the delayed reference clock to output the detection result as a DOWN signal;
transition point detection means for detecting a transition point of the delayed data signal to output the detection result as an UP signal;
determination means for receiving the UP signal and the DOWN signal to determine a state of a phase difference detection process;
masking means for starting the output of the UP signal and the DOWN signal based on the comparison enable signal, and stopping the output of the UP signal and the DOWN signal based on an output of the determination means.

16. The phase comparator of claim 15, wherein:
the comparison period detection means holds the first clock signal and the second clock signal at a transition point of the data signal, outputs a comparison enable signal when the result of holding the first clock signal is H and the result of holding the second clock signal is L, and is reset at a predetermined point in time between when a period of time necessary for the comparison enable signal to settle elapses since a transition point of the data signal and a next rising edge of the first clock signal;
the delay means delays the data signal, the reference clock and a reset signal to output a delayed data signal, a delay reference clock and a delayed reset signal, respectively, wherein the reset signal is output at a predetermined point in time after a delay value defined by the delay means elapses since a rising edge of the second clock signal, and the reset signal is stopped at a predetermined point in time within a period of a length T immediately before a next rising edge of the first clock signal;
when the transition point detection means detects a transition point of the delayed data signal, the transition point detection means holds and outputs the detection result as the UP signal, and the transition point detection means resets a stored content thereof when receiving a clear signal output from the determination means;
when the reference point detection means detects a clock edge of the delay reference clock, the reference point detection means holds and outputs the detection result as the DOWN signal, and the reference point detection means resets the stored content thereof when receiving a clear signal output from the determination means;
the determination means outputs a comparison completion signal when both of the UP signal and the DOWN signal are output, and further outputs the clear signal when the delayed reset signal is received or when the comparison completion signal is output; and
the masking means starts masking the UP signal and the DOWN signal when the comparison completion signal is output, and stops the masking to allow the UP signal and the DOWN signal to pass therethrough when the comparison enable signal is output.

17. A phase regulation circuit in data communication where a data rate is 1/T bps, comprising:
a VCO for outputting N phases of clock signals whose phase difference is 1/N (N is an integer greater than or equal to 1) of an oscillation frequency thereof;
a phase comparator to which the N phases of clock signals and received data are input;
a charge pump for controlling a current based on an UP signal and a DOWN signal, which are output from the phase comparator; and
a low pass filter for converting an output current from the charge pump to a voltage, wherein the oscillation frequency of the VCO is controlled based on the output voltage from the low pass filter, and
the phase comparator is for use in clock data recovery means for performing phase regulation and receiving data by using 2N+1 phases of clock signals whose period is (2N+1)T (N is an integer greater than or equal to 1) and whose phase difference is 1T in data communication where a data rate is 1/T bps, the phase comparator comprising:

2N+1 comparison period detection means each for determining whether it is within an $m^{th}$ comparison period, which is defined as a period between a rising edge of a first clock signal and a rising edge of a second clock signal, to output the determination result as an $m^{th}$ comparison enable signal, wherein the first clock signal is the $(m-1)^{th}$-phase (m−1 is a remainder of division by 2N+1 when it is greater than or equal to 0 and is obtained as m+2N when it is a negative number) clock signal among the 2N+1 phases of clock signals, and the second clock signal is the $m^{th}$-phase (m is an integer greater than or equal to 0 and less than or equal to 2N) clock signal, and 2N+1 phase difference detection means each for receiving the $m^{th}$ comparison enable signal, the data and a reference clock to output information on a phase difference between the reference clock and the data when the $m^{th}$ comparison enable signal is active, wherein the reference clock is the $(N+m)^{th}$-phase (N+m is a remainder of division by 2N+1) clock signal, and wherein:

the comparison period detection means outputs a comparison enable signal by determining whether a transition point of a data signal has occurred within the comparison period; and the phase difference detection means includes:

reference point detection means for detecting an edge of the reference clock to output the detection result as a DOWN signal;

transition point detection means for detecting a transition point of the data signal to output the detection result as an UP signal;

determination means for receiving the UP signal to determine whether there is a data transition point within the comparison period;

delay means for delaying each of the UP signal and the DOWN signal; and masking means for allowing an output of the delay means to pass therethrough when there is a transition of data and masking the output of the delay means when there is no transition of data, based on an output of the determination means.

18. A phase regulation circuit in data communication where a data rate is 1/T bps, comprising:

a PLL whose oscillation frequency is NT (N is an integer greater than or equal to 1);

a DLL for delaying an output clock from the PLL;

a delay line for receiving an output from the DLL to output N phases of clock signals whose phases are shifted from one another by T;

a phase comparator to which the N phases of clock signals and received data are input;

a charge pump for controlling a current based on an UP signal and a DOWN signal, which are output from the phase comparator; and a low pass filter for converting an output current from the charge pump to a voltage, wherein the delay value of the DLL is controlled based on the output voltage from the low pass filter, and the phase comparator is for use in clock data recovery means for performing phase regulation and receiving data by using 2N+1 phases of clock signals whose period is (2N+1)T (N is an integer greater than or equal to 1) and whose phase difference is 1T in data communication where a data rate is 1/T bps, the phase comparator comprising:

2N+1 comparison period detection means each for determining whether it is within an $m^{th}$ comparison period, which is defined as a period between a rising edge of a first clock signal and a rising edge of a second clock signal, to output the determination result as an $m^{th}$ comparison enable signal, wherein the first clock signal is the $(m-1)^{th}$-phase (m−1 is a remainder of division by 2N+1 when it is greater than or equal to 0 and is obtained as m+2N when it is a negative number) clock signal among the 2N+1 phases of clock signals, and the second clock signal is the $m^{th}$-phase (m is an integer greater than or equal to 0 and less than or equal to 2N) clock signal; and 2N+1 phase difference detection means each for receiving the $m^{th}$ comparison enable signal, the data and a reference clock to output information on a phase difference between the reference clock and the data when the $m^{th}$ comparison enable signal is active, wherein the reference clock is the $(N+m)^{th}$-phase (N+m is a remainder of division by 2N+1) clock signal, and wherein:

the comparison period detection means outputs a comparison enable signal by determining whether a transition point of a data signal has occurred within the comparison period; and the phase difference detection means includes:

reference point detection means for detecting an edge of the reference clock to output the detection result as a DOWN signal;

transition point detection means for detecting a transition point of the data signal to output the detection result as an UP signal;

determination means for receiving the UP signal to determine whether there is a data transition point within the comparison period;

delay means for delaying each of the UP signal and the DOWN signal; and masking means for allowing an output of the delay means to pass therethrough when there is a transition of data and masking the output of the delay means when there is no transition of data, based on an output of the determination means.

19. The phase comparator of claim 2, wherein:

the comparison period detection means outputs a comparison enable signal by determining whether a transition point of a data signal has occurred within the comparison period; and the phase difference detection means includes:

reference point detection means for detecting an edge of the reference clock to output the detection result as a DOWN signal;

transition point detection means for detecting a transition point of the data signal to output the detection result as an UP signal;

determination means for receiving the UP signal to determine whether there is a data transition point within the comparison period;

delay means for delaying each of the UP signal and the DOWN signal; and masking means for allowing an output of the delay means to pass therethrough when there is a transition of data and masking the output of the delay means when there is no transition of data, based on an output of the determination means.

20. The phase comparator of claim 2, wherein:
the comparison period detection means activates the comparison enable signal based on a state of the first clock signal and a state of the second clock signal at a transition point of a data signal; and
the phase difference detection means includes:
reference point detection means for detecting an edge of the reference clock to output the detection result as a DOWN signal;
determination means for receiving the comparison enable signal to determine whether there is a data transition point within the comparison period;
delay means for delaying each of the comparison enable signal and the DOWN signal; and
masking means for allowing an output of the delay means to pass therethrough when there is a transition of data and masking the output of the delay means when there is no transition of data, based on an output of the determination means.

21. The phase comparator of claim 2, wherein:
the comparison period detection means outputs a comparison enable signal by determining whether a transition point of a data signal has occurred within the comparison period; and
the phase difference detection means includes:
delay means for delaying each of the data signal and the reference clock;
reference point detection means for detecting an edge of the delayed reference clock to output the detection result as a DOWN signal;
transition point detection means for detecting a transition point of the delayed data signal to output the detection result as an UP signal;
determination means for receiving the UP signal and the DOWN signal to determine a state of a phase difference detection process;
masking means for starting the output of the UP signal and the DOWN signal based on the comparison enable signal, and stopping the output of the UP signal and the DOWN signal based on an output of the determination means.

22. A phase regulation circuit in data communication where a data rate is 1/T bps, comprising:
a VCO for outputting N phases of clock signals whose phase difference is 1/N (N is an integer greater than or equal to 1) of an oscillation frequency thereof;
a phase comparator to which the N phases of clock signals and received data are input;
a charge pump for controlling a current based on an UP signal and a DOWN signal, which are output from the phase comparator; and
a low pass filter for converting an output current from the charge pump to a voltage,
wherein the oscillation frequency of the VCO is controlled based on the output voltage from the low pass filter, and
the phase comparator is for use in clock data recovery means for performing phase regulation and receiving data by using 2N+1 phases of clock signals whose period is (2N+1)T (N is an integer greater than or equal to 1) and whose phase difference is 1 T in data communication where a data rate is 1/T bps, the phase comparator comprising:
2N+1 comparison period detection means each for determining whether it is within an $m^{th}$ comparison period, which is defined as a period between a rising edge of a first clock signal and a rising edge of a second clock signal, to output the determination result as an $m^{th}$ comparison enable signal, wherein the first clock signal is the $(m-1)^{th}$-phase (m−1 is a remainder of division by 2N+1 when it is greater than or equal to 0 and is obtained as m+2N when it is a negative number) clock signal among the 2N+1 phases of clock signals, and the second clock signal is the $m^{th}$-phase (m is an integer greater than or equal to 0 and less than or equal to 2N) clock signal; and
2N+1 phase difference detection means each for receiving the $m^{th}$ comparison enable signal, the data and a reference clock to output information on a phase difference between the reference clock and the data when the $m^{th}$ comparison enable signal is active, wherein the reference clock is the $(N+m)^{th}$-phase (N+m is a remainder of division by 2N+1) clock signal, and
wherein:
the comparison period detection means outputs a comparison enable signal by determining whether a transition point of a data signal has occurred within the comparison period; and
the phase difference detection means includes:
reference point detection means for detecting an edge of the reference clock to output the detection result as a DOWN signal;
transition point detection means for detecting a transition point of the data signal to output the detection result as an UP signal;
determination means for receiving the UP signal to determine whether there is a data transition point within the comparison period;
delay means for delaying each of the UP signal and the DOWN signal; and
masking means for allowing an output of the delay means to pass therethrough when there is a transition of data and masking the output of the delay means when there is no transition of data, based on an output of the determination means, and
wherein:
the comparison period detection means holds the first clock signal and the second clock signal at a transition point of the data signal, is reset at a predetermined point in time between when a period of time necessary for an output of the determination means to settle elapses since a rising edge of the second clock signal and a next rising edge of the first clock signal, and outputs the comparison enable signal when the result of holding the first clock signal is H and the result of holding the second clock signal is L;
when the transition point detection means detects a transition point of the data signal, the transition point detection means holds and outputs the detection result as the UP signal, and the transition point detection means resets a stored content thereof when receiving a clear signal output from the determination means;
when the reference point detection means detects a clock edge of the reference clock, the reference point detection means holds and outputs the detection result as the DOWN signal, and the reference point detection means resets the stored content thereof when receiving the clear signal output from the determination means;
the determination means outputs a comparison completion signal when all of the UP signal, the DOWN signal and the comparison enable signal are output, and further outputs the clear signal when a reset signal is received, when the comparison completion signal is output or when the masking means has stopped a masking stop signal, wherein the reset signal is output at a predetermined point in time after a delay value defined by the delay means elapses since a rising edge of the second clock signal and the reset signal is stopped at a predetermined point in time within a period of a length T immediately before a next rising edge of the first clock signal; and the masking means outputs the masking stop signal to stop masking the output of the delay means when the comparison completion signal is output, and stops the masking stop signal to start masking the output when the reset signal is output.

23. A phase regulation circuit in data communication where a data rate is 1/T bps, comprising:

a PLL whose oscillation frequency is NT (N is an integer greater than or equal to 1);

a DLL for delaying an output clock from the PLL;

a delay line for receiving an output from the DLL to output N phases of clock signals whose phases are shifted from one another by T;

phase comparator to which the N phases of clock signals and received data are input;

a charge pump for controlling a current based on an UP signal and a DOWN signal, which are output from the phase comparator; and a low pass filter for converting an output current from the charge pump to a voltage, wherein the delay value of the DLL is controlled based on the output voltage from the low pass filter, and the phase comparator is for use in clock data recovery means for performing phase regulation and receiving data by using 2N+1 phases of clock signals whose period is (2N+1)T (N is an integer greater than or equal to 1) and whose phase difference is 1T in data communication where a data rate is 1/T bps, the phase comparator comprising:

2N+1 comparison period detection means each for determining whether it is within an $m^{th}$ comparison period, which is defined as a period between a rising edge of a first clock signal and a rising edge of a second clock signal, to output the determination result as an $m^{th}$ comparison enable signal, wherein the first clock signal is the $(m-1)^{th}$-phase (m−1 is a remainder of division by 2N+1 when it is greater than or equal to 0 and is obtained as m+2N when it is a negative number) clock signal among the 2N+1 phases of clock signals, and the second clock signal is the $m^{th}$-phase (m is an integer greater than or equal to 0 and less than or equal to 2N) clock signal; and 2N+1 phase difference detection means each for receiving the $m^{th}$ comparison enable signal, the data and a reference clock to output information on a phase difference between the reference clock and the data when the $m^{th}$ comparison enable signal is active, wherein the reference clock is the $(N+m)^{th}$-phase (N+m is a remainder of division by 2N+1) clock signal, and wherein:

the comparison period detection means outputs a comparison enable signal by determining whether a transition point of a data signal has occurred within the comparison period; and the phase difference detection means includes:

reference point detection means for detecting an edge of the reference clock to output the detection result as a DOWN signal;

transition point detection means for detecting a transition point of the data signal to output the detection result as an UP signal;

determination means for receiving the UP signal to determine whether there is a data transition point within the comparison period;

delay means for delaying each of the UP signal and the DOWN signal; and masking means for allowing an output of the delay means to pass therethrough when there is a transition of data and masking the output of the delay means when there is no transition of data, based on an output of the determination means, and wherein:

the comparison period detection means holds the first clock signal and the second clock signal at a transition point of the data signal, is reset at a predetermined point in time between when a period of time necessary for an output of the determination means to settle elapses since a rising edge of the second clock signal and a next rising edge of the first clock signal, and outputs the comparison enable signal when the result of holding the first clock signal is H and the result of holding the second clock signal is L;

when the transition point detection means detects a transition point of the data signal, the transition point detection means holds and outputs the detection result as the UP signal, and the transition point detection means resets a stored content thereof when receiving a clear signal output from the determination means;

when the reference point detection means detects a clock edge of the reference clock, the reference point detection means holds and outputs the detection result as the DOWN signal, and the reference point detection means resets the stored content thereof when receiving the clear signal output from the determination means;

the determination means outputs a comparison completion signal when all of the UP signal, the DOWN signal and the comparison enable signal are output, and further outputs the clear signal when a reset signal is received, when the comparison completion signal is output or when the masking means has stopped a masking stop signal, wherein the reset signal is output at a predetermined point in time after a delay value defined by the delay means elapses since a rising edge of the second clock signal, and the reset signal is stopped at a predetermined point in time within a period of a length T immediately before a next rising edge of the first clock signal; and the masking means outputs the masking stop signal to stop masking the output of the delay means when the comparison completion signal is output, and stops the masking stop signal to start masking the output when the reset signal is output.

* * * * *